US010784546B2

(12) United States Patent
Piggott et al.

(10) Patent No.: US 10,784,546 B2
(45) Date of Patent: Sep. 22, 2020

(54) THERMOELECTRIC-BASED THERMAL MANAGEMENT SYSTEM

(71) Applicant: Gentherm Incorporated, Northville, MI (US)

(72) Inventors: Alfred Piggott, Redford, MI (US); Dmitri Kossakovski, S. Pasadena, CA (US); Todd Robert Barnhart, Bloomfield Hills, MI (US)

(73) Assignee: GENTHERM INCORPORATED, Northville, MI (US)

( * ) Notice: Subject to any disclaimer, the term of this patent is extended or adjusted under 35 U.S.C. 154(b) by 0 days.

(21) Appl. No.: 16/388,805

(22) Filed: Apr. 18, 2019

(65) Prior Publication Data

US 2019/0252745 A1 Aug. 15, 2019

Related U.S. Application Data

(63) Continuation of application No. 14/760,680, filed as application No. PCT/US2014/013452 on Jan. 28, 2014, now Pat. No. 10,270,141.

(Continued)

(51) Int. Cl.
*H01M 10/6572* (2014.01)
*H05K 3/32* (2006.01)

(Continued)

(52) U.S. Cl.
CPC ..... *H01M 10/6572* (2015.04); *H01M 10/655* (2015.04); *H02J 7/0068* (2013.01);

(Continued)

(58) Field of Classification Search
None
See application file for complete search history.

(56) References Cited

U.S. PATENT DOCUMENTS 1,120,781 A 12/1914 Altenkirch et al.
2,499,901 A 3/1950 Brown, Jr.

(Continued)

FOREIGN PATENT DOCUMENTS

CN 1295345 5/2001
CN 1343294 4/2002

(Continued)

OTHER PUBLICATIONS

U.S. Appl. No. 16/355,550, filed Mar. 15, 2019, Kossakovski et al.

(Continued)

*Primary Examiner* — Rena Dye Cronin
(74) *Attorney, Agent, or Firm* — Knobbe, Martens, Olson & Bear, LLP

(57) ABSTRACT

Disclosed embodiments include thermoelectric-based thermal management systems and methods configured to heat and/or cool an electrical device. Thermal management systems can include at least one electrical conductor in electrical and thermal communication with a temperature-sensitive region of the electrical device and at least one thermoelectric device in thermal communication with the at least one electrical conductor. Electric power can be directed to the thermoelectric device by the same electrical conductor or an external power supply, causing the thermoelectric device to provide controlled heating and/or cooling to the electrical device via the at least one electrical conductor. The thermoelectric management system can be integrated with the management system of the electrical device on a printed circuit substrate.

21 Claims, 15 Drawing Sheets

Related U.S. Application Data

(60) Provisional application No. 61/758,637, filed on Jan. 30, 2013.

(51) Int. Cl.
*H02J 7/00* (2006.01)
*H01M 10/655* (2014.01)
*H01M 10/615* (2014.01)
*H01M 10/613* (2014.01)

(52) U.S. Cl.
CPC ........... *H05K 3/325* (2013.01); *H01M 10/613* (2015.04); *H01M 10/615* (2015.04); *Y10T 29/49112* (2015.01); *Y10T 29/49131* (2015.01)

(56) References Cited

U.S. PATENT DOCUMENTS 2,938,357 A 5/1960 Sheckler
2,992,538 A 7/1961 Siegfried
3,004,393 A 10/1961 Alsing
3,006,979 A 10/1961 Rich
3,019,609 A 2/1962 Pietsch
3,071,495 A 1/1963 Hanlein
3,126,116 A 3/1964 Clinehens
3,129,116 A 4/1964 Corry
3,137,142 A 6/1964 Venema
3,178,895 A 4/1965 Mole et al.
3,508,974 A 4/1970 Bressler
3,522,106 A 7/1970 Debiesse et al.
3,527,621 A 9/1970 Newton
3,554,815 A 1/1971 Osborn
3,561,224 A 2/1971 Banks et al.
3,607,444 A 9/1971 Debucs
3,626,704 A 12/1971 Coe, Jr.
3,635,037 A 1/1972 Hubert
3,663,307 A 5/1972 Mole
3,681,929 A 8/1972 Schering
3,726,100 A 4/1973 Widakowich
3,958,324 A 5/1976 Alais et al.
4,038,831 A 8/1977 Gaudel et al.
4,055,053 A 10/1977 Elfving
4,056,406 A 11/1977 Markman et al.
4,065,936 A 1/1978 Fenton et al.
4,199,953 A 4/1980 Richter, Jr. et al.
4,229,687 A 10/1980 Newman
4,242,778 A 1/1981 Kay
4,281,516 A 8/1981 Berthet et al.
4,297,841 A 11/1981 Cheng
4,297,849 A 11/1981 Buffet
4,314,008 A 2/1982 Blake
4,324,845 A 4/1982 Stockel
4,402,188 A 9/1983 Skala
4,420,940 A 12/1983 Buffet
4,444,851 A 4/1984 Maru
4,448,028 A 5/1984 Chao et al.
4,494,380 A 1/1985 Cross
4,499,329 A 2/1985 Benicourt et al.
4,634,803 A 1/1987 Mathiprakasam
4,651,019 A 3/1987 Gilbert et al.
4,730,459 A 3/1988 Schicklin et al.
4,802,929 A 2/1989 Schock
4,865,929 A 9/1989 Eck
4,907,060 A 3/1990 Nelson et al.
4,989,626 A 2/1991 Takagi et al.
4,999,576 A 3/1991 Levinson
5,006,178 A 4/1991 Bijvoets
5,015,545 A 5/1991 Brooks
5,071,652 A 12/1991 Jones et al.
5,121,047 A 6/1992 Goedken et al.
5,141,826 A 8/1992 Bohm et al.
5,171,372 A 12/1992 Recine, Sr.
5,180,293 A 1/1993 Hartl
5,197,291 A 3/1993 Levinson
5,228,923 A 7/1993 Hed
5,229,702 A 7/1993 Boehling
5,232,516 A 8/1993 Hed
5,254,178 A 10/1993 Yamada et al.
5,395,708 A 3/1995 Hall
5,419,780 A 5/1995 Suski
5,429,680 A 7/1995 Fuschetti
5,430,322 A 7/1995 Koyanagi et al.
5,456,081 A 10/1995 Chrysler et al.
5,497,625 A 3/1996 Manz et al.
5,544,487 A 8/1996 Attey et al.
5,561,981 A 10/1996 Quisenberry et al.
5,576,512 A 11/1996 Doke
5,584,183 A 12/1996 Wright et al.
5,592,363 A 1/1997 Atarashi et al.
5,594,609 A 1/1997 Lin
5,623,195 A 4/1997 Bullock et al.
5,650,904 A 7/1997 Gilley et al.
5,682,748 A 11/1997 DeVilbiss et al.
5,705,770 A 1/1998 Ogassawara et al.
5,724,818 A 3/1998 Iwata et al.
5,822,993 A 10/1998 Attey
5,860,472 A 1/1999 Batchelder
5,867,990 A 2/1999 Ghoshal
5,871,859 A 2/1999 Parise
5,912,092 A 6/1999 Maruyama et al.
5,959,341 A 9/1999 Tsuno et al.
5,966,940 A 10/1999 Gower et al.
5,966,941 A 10/1999 Ghoshal
5,987,890 A 11/1999 Chiu et al.
6,000,225 A 12/1999 Choshal
6,050,326 A 4/2000 Evans
6,057,050 A 5/2000 Parise
6,082,445 A 7/2000 Dugan
6,084,172 A 7/2000 Kishi et al.
6,094,919 A 8/2000 Bhatia
6,096,966 A 8/2000 Nishimoto et al.
6,138,466 A 10/2000 Lake et al.
6,226,994 B1 5/2001 Yamada et al.
6,257,329 B1 7/2001 Balzano
6,282,907 B1 9/2001 Ghoshal
6,294,721 B1 * 9/2001 Oravetz ................. H01L 35/02
136/203
6,302,196 B1 10/2001 Haussmann
6,320,280 B1 11/2001 Kanesaka
6,347,521 B1 2/2002 Kadotani et al.
6,357,518 B1 3/2002 Sugimoto et al.
6,385,976 B1 5/2002 Yamamura et al.
6,446,442 B1 9/2002 Batchelor et al.
6,455,186 B1 9/2002 Moores, Jr. et al.
6,464,027 B1 10/2002 Dage et al.
6,474,073 B1 11/2002 Uetsuji et al.
6,477,844 B2 11/2002 Ohkubo et al.
6,499,306 B2 12/2002 Gillen
6,530,231 B1 3/2003 Nagy et al.
6,539,725 B2 4/2003 Bell
6,548,750 B1 4/2003 Picone
6,563,039 B2 5/2003 Caillat et al.
6,570,362 B1 5/2003 Estes et al.
6,580,025 B2 6/2003 Guy
6,588,217 B2 7/2003 Ghoshal
6,598,403 B1 7/2003 Ghoshal
6,598,405 B2 7/2003 Bell
6,606,866 B2 8/2003 Bell
6,613,972 B2 9/2003 Cohen et al.
6,637,210 B2 10/2003 Bell
6,645,666 B1 11/2003 Moores, Jr. et al.
6,653,002 B1 11/2003 Parise
6,658,861 B1 12/2003 Ghoshal et al.
6,672,076 B2 1/2004 Bell
6,700,052 B2 3/2004 Bell
6,705,089 B2 3/2004 Chu et al.
6,718,954 B2 4/2004 Ryon
6,767,666 B2 7/2004 Nemoto
6,812,395 B2 11/2004 Bell
6,880,346 B1 4/2005 Tseng et al.
6,907,739 B2 6/2005 Bell
6,948,321 B2 9/2005 Bell
6,949,309 B2 9/2005 Moores, Jr. et al.
6,959,555 B2 11/2005 Bell

(56) References Cited

U.S. PATENT DOCUMENTS 7,014,945 B2 3/2006 Moores, Jr. et al.
7,056,616 B2 6/2006 Moores, Jr. et al.
7,061,208 B2 6/2006 Nishihata et al.
7,111,465 B2 9/2006 Bell
7,222,489 B2 5/2007 Pastorino
7,230,404 B2 6/2007 Kimoto et al.
7,231,772 B2 6/2007 Bell
7,235,735 B2 6/2007 Venkatasubramanian et al.
7,252,904 B2 8/2007 Moores, Jr. et al.
7,270,910 B2 9/2007 Yahnker et al.
7,326,490 B2 2/2008 Moores, Jr. et al.
7,380,586 B2 6/2008 Gawthrop
7,384,704 B2 6/2008 Scott
7,421,845 B2 9/2008 Bell
7,475,551 B2 1/2009 Ghoshal
7,523,617 B2 4/2009 Venkatasubramanian et al.
7,531,270 B2 5/2009 Buck et al.
7,587,902 B2 9/2009 Bell
7,592,776 B2 9/2009 Tsukamoto et al.
7,788,933 B2 9/2010 Goenka
7,863,866 B2 1/2011 Wolf
7,870,745 B2 1/2011 Goenka
7,915,516 B2 3/2011 Hu
7,926,293 B2 4/2011 Bell
7,932,460 B2 4/2011 Bell
7,942,010 B2 5/2011 Bell
7,946,120 B2 5/2011 Bell
8,039,726 B2 10/2011 Zhang et al.
8,079,223 B2 12/2011 Bell
8,163,647 B2 4/2012 Kawabata et al.
8,375,728 B2 2/2013 Bell
8,424,315 B2 4/2013 Goenka
8,492,642 B2 7/2013 Kim
8,495,884 B2 7/2013 Bell et al.
8,540,466 B2 9/2013 Halliar
8,614,390 B2 12/2013 Watts
8,640,466 B2 2/2014 Bell et al.
8,646,262 B2 2/2014 Magnetto
8,658,881 B2 2/2014 Cheng et al.
8,701,422 B2 4/2014 Bell et al.
8,722,222 B2 5/2014 Kossakovski et al.
8,841,015 B2 9/2014 Yoon
8,915,091 B2 12/2014 Goenka
8,969,704 B2 3/2015 Bruck et al.
8,974,942 B2 3/2015 Bell et al.
9,006,557 B2 4/2015 LaGrandeur et al.
9,020,572 B2 4/2015 Mensinger et al.
9,105,809 B2 8/2015 Lofy
9,293,680 B2 3/2016 Poliquin et al.
9,306,143 B2 4/2016 Ranalli et al.
9,590,282 B2 3/2017 Kossakovski et al.
9,666,914 B2 5/2017 Bell et al.
9,671,142 B2 6/2017 Kossakovski et al.
9,719,701 B2 8/2017 Bell et al.
9,863,672 B2 1/2018 Goenka
9,899,711 B2 2/2018 Piggott et al.
10,170,811 B2 1/2019 Kossakovski et al.
10,236,547 B2 3/2019 Kossakovski et al.
10,270,141 B2 4/2019 Piggott et al.
2003/0094265 A1 5/2003 Chu et al.
2003/0106677 A1 6/2003 Memory et al.
2004/0089336 A1 5/2004 Hunt
2004/0177876 A1 9/2004 Hightower
2005/0121065 A1 6/2005 Otey
2006/0005873 A1 1/2006 Kambe
2006/0028182 A1 2/2006 Yang et al.
2006/0093896 A1 5/2006 Hong et al.
2006/0124165 A1 6/2006 Bierschenk et al.
2006/0137359 A1 6/2006 Ghoshal
2006/0137360 A1 6/2006 Ghoshal
2006/0168969 A1 8/2006 Mei et al.
2006/0216582 A1 9/2006 Lee et al.
2006/0219281 A1 10/2006 Kuroyanagi et al.
2006/0237730 A1 10/2006 Abramov
2007/0034356 A1 2/2007 Kenny et al.
2007/0125413 A1 6/2007 Olsen et al.
2007/0193280 A1 8/2007 Tuskiewicz et al.
2007/0204850 A1 9/2007 Pickard et al.
2007/0220902 A1 9/2007 Matsuoka et al.
2007/0261914 A1 11/2007 Wahlgren et al.
2008/0239675 A1 10/2008 Speier
2008/0289677 A1 11/2008 Bell
2008/0311466 A1 12/2008 Yang et al.
2009/0007952 A1 1/2009 Kondoh et al.
2009/0032080 A1 2/2009 Kawauchi et al.
2010/0031987 A1 2/2010 Bell et al.
2010/0104935 A1 4/2010 Hermann et al.
2010/0112419 A1 5/2010 Jang et al.
2010/0128439 A1 5/2010 Tilak et al.
2010/0147351 A1 6/2010 Takahashi
2010/0186399 A1 7/2010 Huttinger
2010/0243346 A1 9/2010 Anderson et al.
2010/0326092 A1 12/2010 Goenka
2011/0005562 A1 1/2011 Bisges
2011/0209740 A1 9/2011 Bell et al.
2011/0236731 A1 9/2011 Bell et al.
2011/0244300 A1 10/2011 Closek et al.
2011/0271994 A1 11/2011 Gilley
2012/0046823 A1 2/2012 Schneider et al.
2012/0111386 A1 5/2012 Bell et al.
2012/0129020 A1 5/2012 Lachenmeier et al.
2012/0174567 A1 7/2012 Limbeck et al.
2012/0189902 A1 7/2012 Kim
2012/0244404 A1* 9/2012 Obasih .................. B60L 3/0046 429/99
2012/0282497 A1 11/2012 Yang et al.
2012/0285758 A1 11/2012 Bell et al.
2012/0305043 A1 12/2012 Kossakovski et al.
2013/0059190 A1* 3/2013 Kossakovski ......... H01M 10/60 429/120
2013/0160809 A1 6/2013 Mueller
2013/0183566 A1 7/2013 Wayne et al.
2013/0186448 A1 7/2013 Ranalli et al.
2013/0207617 A1* 8/2013 Houchin-Miller ........................... H01M 10/615 320/150
2013/0216887 A1 8/2013 Wayne et al.
2013/0255739 A1 10/2013 Kossakovski et al.
2013/0340802 A1 12/2013 Jovovic et al.
2014/0023897 A1 1/2014 Suga
2014/0030560 A1 1/2014 Lev et al.
2014/0096807 A1 4/2014 Ranalli
2014/0124176 A1 5/2014 Zhamu et al.
2014/0165597 A1 6/2014 Hernon et al.
2015/0101353 A1 4/2015 Oh et al.
2015/0101354 A1 4/2015 Oh et al.
2015/0101355 A1 4/2015 Oh et al.
2015/0194590 A1 7/2015 LaGrandeur
2016/0240585 A1 8/2016 Ranalli et al.
2017/0294692 A1 10/2017 Bell et al.
2017/0314824 A1 11/2017 Kossakovski et al.
2017/0343253 A1 11/2017 Bell et al.
2018/0226699 A1 8/2018 Piggott et al.

FOREIGN PATENT DOCUMENTS

CN 100446339 12/2008
CN 101662054 3/2010
CN 102769157 11/2012
CN 106030989 10/2016
DE 4 329 816 3/1994
DE 10 2010 012 629 9/2011
DE 10 2010 035 152 2/2012
EP 0 272 937 6/1988
EP 0 878 851 11/1998
EP 1 174 996 1/2002
EP 1 475 532 11/2004
EP 1 515 376 3/2005
EP 1 641 067 3/2006
EP 1 780 807 5/2007
EP 1 906 463 4/2008
EP 2 275 755 1/2011
EP 2 378 577 10/2011

(56) References Cited

FOREIGN PATENT DOCUMENTS

| | | | |
|---|---|---|---|
| EP | 2 439 799 | | 4/2012 |
| EP | 2 541 634 | | 1/2013 |
| EP | 2 565 977 | | 3/2013 |
| FR | 1 280 711 | | 1/1962 |
| FR | 2 261 638 | | 9/1975 |
| FR | 2 316 557 | | 1/1977 |
| FR | 2 419 479 | | 10/1979 |
| FR | 2 481 786 | | 11/1981 |
| FR | 2 543 275 | | 9/1984 |
| FR | 2 550 324 | | 2/1985 |
| FR | 2 806 666 | | 9/2001 |
| FR | 2 879 728 | | 6/2006 |
| FR | 2 903 057 | | 1/2008 |
| GB | 231 192 | A | 5/1926 |
| GB | 817 077 | | 7/1959 |
| GB | 952 678 | | 3/1964 |
| GB | 1 151 947 | | 5/1969 |
| GB | 2 027 534 | | 2/1980 |
| GB | 2 267 338 | | 12/1993 |
| GB | 2 333 352 | | 7/1999 |
| JP | 45-008280 | | 3/1970 |
| JP | 59-097457 | | 6/1984 |
| JP | 60-080044 | | 5/1985 |
| JP | 63-262076 | | 10/1988 |
| JP | 01-131830 | | 5/1989 |
| JP | 01-200122 | | 8/1989 |
| JP | 03-102219 | | 10/1991 |
| JP | 03-263382 | | 11/1991 |
| JP | 04-165234 | | 6/1992 |
| JP | 05-006687 | | 1/1993 |
| JP | 06-089955 | | 3/1994 |
| JP | 06-207771 | | 7/1994 |
| JP | 06-342940 | | 12/1994 |
| JP | 07-007187 | | 1/1995 |
| JP | 07-198284 | | 1/1995 |
| JP | 07-074397 | | 3/1995 |
| JP | 07-202275 | | 8/1995 |
| JP | 07-226538 | | 8/1995 |
| JP | 07-253264 | | 10/1995 |
| JP | 07-307493 | | 11/1995 |
| JP | 08-222771 | | 8/1996 |
| JP | 08-293627 | | 11/1996 |
| JP | 09-042801 | | 2/1997 |
| JP | 09-089284 | | 4/1997 |
| JP | 09-276076 | | 10/1997 |
| JP | 09-321355 | | 12/1997 |
| JP | 10-012935 | | 1/1998 |
| JP | 10-035268 | | 2/1998 |
| JP | 10-092394 | | 4/1998 |
| JP | 10-238406 | | 9/1998 |
| JP | 10-275943 | | 10/1998 |
| JP | 10-290590 | | 10/1998 |
| JP | 10-325561 | | 12/1998 |
| JP | 11-032492 | | 2/1999 |
| JP | 11-046021 | | 2/1999 |
| JP | 11-182907 | | 7/1999 |
| JP | 11-201475 | | 7/1999 |
| JP | 11-274574 | | 10/1999 |
| JP | 11-274575 | | 10/1999 |
| JP | 11-317481 | | 11/1999 |
| JP | 2000-018095 | | 1/2000 |
| JP | 2000-058930 | | 2/2000 |
| JP | 2000-208823 | | 7/2000 |
| JP | 2000-214934 | | 8/2000 |
| JP | 2000-274788 | | 10/2000 |
| JP | 2000-274871 | | 10/2000 |
| JP | 2000-274874 | | 10/2000 |
| JP | 2001-007263 | | 1/2001 |
| JP | 2001-210879 | | 8/2001 |
| JP | 2001-267642 | | 9/2001 |
| JP | 2001-304778 | | 10/2001 |
| JP | 2001-336853 | | 12/2001 |
| JP | 2002-13758 | | 1/2002 |
| JP | 2002-059736 | | 2/2002 |
| JP | 2002-232028 | | 8/2002 |
| JP | 2003-217735 | | 7/2003 |
| JP | 2003-259671 | | 9/2003 |
| JP | 10-2003-0082589 | | 10/2003 |
| JP | 2003-007356 | | 10/2003 |
| JP | 2003-332642 | | 11/2003 |
| JP | 2004-079883 | | 3/2004 |
| JP | 2004-360522 | | 12/2004 |
| JP | 2005-057006 | | 3/2005 |
| JP | 2005-294695 | | 10/2005 |
| JP | 2005-317648 | | 11/2005 |
| JP | 2006-093526 | | 4/2006 |
| JP | 2006-127920 | | 5/2006 |
| JP | 2006-278327 | | 10/2006 |
| JP | 2001-024240 | | 1/2007 |
| JP | 2008-047371 | | 2/2008 |
| JP | 2008047371 | * | 2/2008 |
| JP | 2008-091183 | | 4/2008 |
| JP | 2008-108509 | | 5/2008 |
| JP | 2008-166292 | | 7/2008 |
| JP | 2008-218352 | | 9/2008 |
| JP | 2008-226617 | | 9/2008 |
| JP | 2008-274790 | | 11/2008 |
| JP | 2008-300465 | | 12/2008 |
| JP | 2009-010138 | | 1/2009 |
| JP | 2009-033806 | | 2/2009 |
| JP | 2009-170259 | | 7/2009 |
| JP | 2009-181853 | | 8/2009 |
| JP | 2009-245730 | | 10/2009 |
| JP | 2009245730 | * | 10/2009 |
| JP | 2009-289429 | | 12/2009 |
| JP | 2009-302054 | | 12/2009 |
| JP | 2010-108932 | | 5/2010 |
| JP | 2010-113861 | | 5/2010 |
| JP | 2010-198930 | | 9/2010 |
| JP | 2011-023180 | | 2/2011 |
| JP | 2012-079553 | | 4/2012 |
| JP | 2012-512504 | | 5/2012 |
| JP | 2012-516007 | | 7/2012 |
| JP | 2012-156131 | | 8/2012 |
| JP | 2012-174496 | | 9/2012 |
| JP | 2012-522176 | | 9/2012 |
| JP | 2012-216422 | | 11/2012 |
| JP | 2012-216423 | | 11/2012 |
| JP | 2012-234749 | | 11/2012 |
| JP | 2013-077432 | | 4/2013 |
| JP | 5893556 | | 3/2016 |
| JP | 2016-0540344 | | 12/2016 |
| KR | 10-2008-0090162 | | 10/2008 |
| KR | 10-2011-0128639 | | 11/2011 |
| KR | 10-2011-0134960 | A | 12/2011 |
| KR | 10-1721256 | B1 | 3/2017 |
| LU | 66619 | | 2/1973 |
| RU | 2 142 178 | | 11/1999 |
| RU | 2 154 875 | | 8/2000 |
| SE | 329 870 | | 10/1970 |
| SE | 337 227 | | 5/1971 |
| SU | 184886 | | 7/1966 |
| SU | 1142711 | | 2/1985 |
| SU | 1170234 | A | 7/1985 |
| WO | WO 94/01893 | | 1/1994 |
| WO | WO 97/22486 | | 6/1997 |
| WO | WO 97/47930 | | 12/1997 |
| WO | WO 98/034451 | | 8/1998 |
| WO | WO 98/56047 | | 12/1998 |
| WO | WO 99/10191 | | 3/1999 |
| WO | WO 01/52332 | | 7/2001 |
| WO | WO 02/065029 | | 8/2002 |
| WO | WO 02/065030 | | 8/2002 |
| WO | WO 02/081982 | | 10/2002 |
| WO | WO 03/074951 | | 9/2003 |
| WO | WO 03/090286 | | 10/2003 |
| WO | WO 2004/019379 | | 3/2004 |
| WO | WO 2004/026757 | | 4/2004 |
| WO | WO 2005/023571 | | 3/2005 |
| WO | WO 2006/001827 | | 1/2006 |
| WO | WO 2006/037178 | | 4/2006 |
| WO | WO 2006/064432 | | 6/2006 |
| WO | WO 2007/097059 | | 8/2007 |
| WO | WO 2007/109368 | | 9/2007 |

(56) References Cited

FOREIGN PATENT DOCUMENTS

| | | |
|---|---|---|
| WO | WO 2008/013946 | 1/2008 |
| WO | WO 2008/025707 | 3/2008 |
| WO | WO 2008/091293 | 7/2008 |
| WO | WO 2009/053858 | 4/2009 |
| WO | WO 2010/071463 | 6/2010 |
| WO | WO 2010/0112961 | 10/2010 |
| WO | WO 2010/135371 | 11/2010 |
| WO | WO 2011/011795 | 1/2011 |
| WO | WO 2012/022684 | 2/2012 |
| WO | WO 2012/023249 | 2/2012 |
| WO | WO 2012/031980 | 3/2012 |
| WO | WO 2012/045542 | 4/2012 |
| WO | WO 2012/061763 | 5/2012 |
| WO | WO 2012/137289 | 10/2012 |
| WO | WO 2012/170443 | 12/2012 |
| WO | WO 2013/029744 | 3/2013 |
| WO | WO 2014/055447 | 4/2014 |
| WO | WO 2014/110524 | 7/2014 |
| WO | WO 2014/120688 | 8/2014 |
| WO | WO 2014/134369 | 9/2014 |
| WO | WO 2015/066079 | 5/2015 |
| WO | WO 2016/040872 | 3/2016 |

OTHER PUBLICATIONS

U.S. Appl. No. 15/042,846, filed Feb. 12, 2016.
U.S. Appl. No. 16/226,418, filed Dec. 19, 2018, Kossakovski et al.
Behr, "Li-on Battery Cooling", Power Point Presentation, Stuttgart, May 20, 2009, 13 pages.
Behr, "Thermal Management for Hybrid Vehicles", Power Point Presentation, Technical Press Day 2009, 20 pages.
Chacko, Salvio et al., "Thermal modelling of Li-ion polymer battery for electric vehicle drive cycles", Journal of Power Sources, vol. 213, Sep. 2012, pp. 296-303.
DERWENT-ACC-No. 1998-283540, Kwon, H et al., Hyundai Motor Co., corresponding to KR 97026106 A, published Jun. 24, 1997 (2 pages).
Diller, R. W., et al.: "Experimental results confirming improved performance of systems using thermal isolation" Thermoelectrics, 2002. Proceedings ICT '02. Twenty-First International Conference on Aug. 25-29, 2002, Piscataway, NJ USA, IEEE, Aug. 25, 2002 (Aug. 25, 2002), pp. 548-550, XP010637541 ISBN: 0-7803-7683-8.
Diller, R.W., et al., "Experimental Results Confirming Improved Efficiency of Thermoelectric Power Generation Systems with Alternate Thermodynamic Cycles," 22nd International Conference on Thermoelectrics, 2003, pp. 571-573.
Esfahanian, Vahid et al., "Design and Simulation of Air Cooled Battery Thermal Management System Using Thermoelectric for a Hybrid Electric Bus", Proceedings of the FISITA 2012 World Automotive Congress, vol. 3, Lecture notes in Electrical Engineering, vol. 191, 2013.
Funahashi et al., "Preparation and properties of thermoelectric pipe-type modules", ICT 25th International Conference on Aug. 6-10, 2006, Thermoelectrics, 2006, pp. 58-61.
Goldsmid, H.J., "Electronic Refrigeration", Pion Ltd, 207 Brondesbury Park, London (1986), in 235 pages.
Hendricks, Terry et al., "Advanced Thermoelectric Power System Investigations for Light-Duty and Heavy Duty Applications," National Renewable Energy Laboratory, Center for Transportation Technology & Systems, Colorado, Proc. 21st Int'l Cont. on Thermoelectrics, Aug. 2002, pp. 381-386.
Horie, et al.,"A Study on an Advanced Lithium-ion Battery System for EVs", The World Electric Vehicle Journal, 2008, vol. 2, Issue 2, pp. 25-31.
International Search Report and Written Opinion, re PCT Application No. PCT/US2014/013452, dated May 8, 2014.
International Preliminary Report on Patentability, re PCT Application No. PCT/US2014/013452, dated Aug. 4, 2015.
Ioffe, A.F., "Semiconductor Thermoelements and Thermoelectronic Cooling", lnfosearch Limited., London (1957), in 41 pages.
Jeon et al., "Development of Battery Pack Design for High Power Li-Ion Battery Pack of HEV", The World Electric Vehicle Association Journal, 2007, vol. 1, pp. 94-99.
Jeon et al., "Thermal modeling of cylindrical lithium ion battery during discharge cycle," Energy Conversion and Management, Aug. 2011, vol. 52, Issues 8-9, pp. 2973-2981.
Kambe et al., "Encapsulated Thermoelectric Modules and Compliant Pads for Advanced Thermoelectric Systems," J. Electronic Materials, vol. 39, No. 9, 1418-21 (2010).
Kays, W.M. et al., "Compact Heat Exchangers", McGraw-Hill Book Company (1984), in 12 pages.
Lofy, John et al., "Thermoelectrics for Environmental Control Automobiles, 21st International Conference on Thermoelectronics," 2002, pp. 471-476.
Menchen, et al., "Thermoelectric Conversion to Recover Heavy Duty Diesel Exhaust Energy", Proceedings of the Annual Automotive Technology Development Contractors Meeting, pp. 445-449, Apr. 1991.
Min et al., "Ring-structured thermoelectric module," Semiconductor Science and Technology, Semicond. Sci. Technol. 22 (2007) 880-8.
Miner, A., et al. "Thermo-Electro-Mechanical Refrigeration Based on Transient Thermoelectric Effects", Applied Physics letters, vol. 75, pp. 1176-1178 (1999).
Morawietz, et al., "Thermoelektrische Modellierung eines Lithium-Lonen-Energiespeichers fuer den Fahrzeugeinsatz," VDI-Berichte, Nov. 2008, Issue 2030, pp. 299-318, along with its English translation.
Sabbah et al., "Passive Thermal Management System for Plug-in Hybrid and Comparison with Active Cooling: Limitation of Temperature Rise and Uniformity of Temperature Distribution," ECS Transactions, The Electrochemical Society, 2008, 13 (19) pp. 41-52.
Snyder, G. Jeffrey, et al., "Thermoelectric Efficiency and Compatibility," The American Physical Society, Oct. 2, 2003, vol. 91, No. 14.
Tada, S., et al., "A New Concept of Porous Thermoelectric Module Using a Reciprocating Flow for Cooling/Heating Systems (Numerical Analysis for Heating Systems)" 16th International Conference on Thermoelectrics (1977).
Thermoelectrics Handbook: Macro to Nano, Thermoelectric Module Design Theories, 11.7 Ring-Structure Module, pp. 11-11 to 11-15. CRC Press, 2006.

* cited by examiner

THERMOELECTRIC-BASED THERMAL MANAGEMENT SYSTEM

INCORPORATION BY REFERENCE TO ANY PRIORITY APPLICATIONS

Any and all applications for which a foreign or domestic priority claim is identified in the Application Data Sheet as filed with the present application are incorporated by reference under 37 CFR 1.57 and made a part of this specification.

BACKGROUND

Field of the Disclosure

This disclosure relates generally to thermoelectric (TE) cooling and heating of electrical devices.

Description of Related Art

Power electronics and other electrical devices, such as batteries, can be sensitive to overheating, cold temperatures, extreme temperatures, and operating temperature limits. The performance of such devices may be diminished, sometimes severely, when the devices are operated outside of recommended temperature ranges. In semiconductor devices, integrated circuit dies can overheat and malfunction. In batteries, including, for example, batteries used for automotive applications in electrified vehicles, battery cells and their components can degrade when overheated or overcooled. Such degradation can manifest itself in reduced battery storage capacity and/or reduced ability for the battery to be recharged over multiple duty cycles.

SUMMARY

It can be advantageous to manage the thermal conditions of power electronics and other electrical devices. Thermal management can reduce incidences of overheating, overcooling, and electrical device degradation. Certain embodiments described herein provide thermal management of devices that carry significant electric power and/or require high current and efficiency (e.g., power amplifiers, transistors, transformers, power inverters, insulated-gate bipolar transistors (IGBTs), electric motors, high power lasers and light-emitting diodes, batteries, and others). A wide range of solutions can be used to thermally manage such devices, including convective air and liquid cooling, conductive cooling, spray cooling with liquid jets, thermoelectric cooling of boards and chip cases, and other solutions. At least some embodiments disclosed herein provide at least one of the following advantages compared to existing techniques for heating or cooling electrical devices: higher power efficiency, lower or eliminated maintenance costs, greater reliability, longer service life, fewer components, fewer or eliminated moving parts, heating and cooling modes of operation, other advantages, or a combination of advantages.

In electrical devices, typically electrically active portions and/or temperature sensitive regions of the device are connected to the outside world, such as, for example, external circuits or devices, via electrical conductors. For example, electrodes of a battery cell can be designed to carry high electric power without significant losses (e.g., heat losses that are proportional to the square of the current, per Joule's Law). The wire gauge of the electrical conductors used for such electrodes is commensurate with the high current that typically flows in such devices. The larger the size of the battery is, the bigger are the electrode posts for connection with outside circuits.

The high electrical conductance of electrodes and many other types of electrical conductors also means that such conductors typically have high thermal conductivity. The high thermal conductivity can be used to solve various thermal management problems, where one can deliver desired thermal power (e.g., cooling, heating, etc.) directly to the sensitive elements of the device by heating and/or cooling the electrodes, bypassing thermally-insensitive elements of the device. Similar to using thermally conditioned blood during blood transfusions for delivering heat deep to the core of human bodies, heat pumping through the electrodes can be used to efficiently deliver desired thermal conditions deep inside an electrical device. As an example, it has been determined that electrode cooling of advanced automotive batteries is one of the most advantageous techniques for battery thermal management. For example, the electrodes can be cooled using solid, liquid, or air cooling techniques. In a sense, electrodes act as cold fingers in such a thermal management arrangement.

Embodiments disclosed herein include systems and methods capable of thermally managing an electrical device by applying direct or indirect thermoelectric (TE) cooling and/or heating to current carrying electrical conductors (e.g., electrodes) of power components, electronics, and other electrical devices. Such devices can often benefit from thermal management. Some embodiments will be described with reference to particular electrical devices, such as, for example, batteries. However, at least some embodiments disclosed herein are capable of providing thermal management to other electrical devices, such as, for example, insulated-gate bipolar transistors (IGBTs), other electrical devices, or a combination of devices. At least some such devices can have high current carrying capacity and can suffer from operation outside of a preferred temperature range. The operation of some embodiments is described with reference to a cooling mode of operation. However, some or all of the embodiments disclosed herein can have a heating mode of operation, as well. In some situations a heating mode of operation can be employed to maintain the temperature of an electrical device above a threshold temperature, under which the electrical device may degrade or exhibit impaired operation. TE devices are uniquely suited to provide both heating and cooling functions with minimum complications for system architecture.

Embodiments disclosed herein include thermoelectric-based thermal management systems and methods. In some embodiments, a thermal management system is configured to manage temperature in a temperature-sensitive region of an electrical device. The thermal management system can include a thermoelectric device configured to transfer thermal energy between a main surface and a waste surface upon application of electric power to the thermoelectric device. In some embodiments, the main surface of the thermoelectric device is in substantial thermal communication with a heat exchange surface of an electrical conductor. The electrical conductor is configured to deliver electric power to or from an electrical device such that the electrical conductor serves as a conduit for conducting thermal energy between a temperature-sensitive region of the electrical device and the thermoelectric device.

In certain embodiments, a method for thermally managing an electrical device includes connecting a heat transfer device that comprises an electrically conductive portion and an electrically insulating portion to a plurality of electrical conductors of an electrical device. The method can include directing substantial thermal energy exchange between the heat transfer device and a main surface of a thermoelectric device.

In some embodiments, a method for thermally managing an electrical device includes establishing substantial thermal communication between a thermoelectric device and a heat exchange surface of an electrical conductor that is in thermal and electrical communication with the electrical device. The method can include heating or cooling the electrical device by adjusting the current directed in or out of the thermoelectric device.

In certain embodiments, a thermoelectric battery thermal management system is provided that is configured to manage temperature in a temperature-sensitive region of a battery cell that comprises a battery management controller configured to control charging and discharging of a battery cell. The system comprises a thermoelectric management controller configured to control electric power delivered to a thermoelectric device, wherein the thermoelectric device is configured to transfer thermal energy between a main surface and a waste surface upon application of electric power to the thermoelectric device. The main surface of the thermoelectric device is attached to a bus bar, wherein the bus bar is in substantial thermal communication with an electrical conductor of the battery cell. The electrical conductor is configured to deliver electric power to or from the battery cell and the electrical conductor serves as a conduit for conducting thermal energy between a temperature-sensitive region of the battery cell and the thermoelectric device. The system comprises a battery enclosure that encloses the battery cell. The system comprises a printed circuit substrate comprising the battery management controller, the thermoelectric management controller, and a data connection between the battery management controller and the thermoelectric management controller. The printed circuit substrate is positioned within the battery enclosure and comprises a power connection for supplying electric power to the thermoelectric device.

In some embodiments, the thermoelectric battery thermal management system comprises a controller in electrical communication with the thermoelectric management controller and configured to control a polarity of electric current provided to the thermoelectric device. A first polarity of electric current is provided in a cooling mode of system operation and wherein a second polarity opposite the first polarity of electric current is provided in a heating mode of system operation.

In some embodiments, the battery management controller is configured to administer control functions to the battery cell.

In some embodiments, the thermoelectric battery thermal management system comprises a temperature sensor in thermal communication with the battery cell and in electrical communication with the thermoelectric management controller.

In some embodiments, the printed circuit substrate comprises a cutout portion configured to receive the thermoelectric device.

In some embodiments, a surface of the bus bar is in direct physical contact with a surface of the electrical conductor.

In some embodiments, the thermoelectric battery thermal management system comprises a blower and duct assembly attached to the printed circuit substrate and configured to push or pull air across the waste surface of the thermoelectric device. The blower and duct assembly comprises a controller in electrical communication with at least one of the battery management controller and thermoelectric management controller such that at least one of the battery management controller and thermoelectric management controller is configured to optimize system efficiency such that airflow from the blower is increased or decreased to match cooling or heating requirements of the battery cell.

In some embodiments, the bus bar comprises one or more mounting holes for mounting the bus bar to the printed circuit substrate and electrical conductor.

In some embodiments, the battery cell is sealed within an enclosure, the enclosure comprising a window of high thermal conductivity material abutting the thermoelectric device configured to provide access for substantial thermal communication between a portion of a waste heat removal system positioned outside the window and the waste surface of the thermoelectric device.

In some embodiments, thermoelectric devices are attached to both a top and bottom surface of the bus bar.

In certain embodiments, a method for thermally managing a battery cell includes controlling charging and discharging of a battery cell using a battery management controller attached to a printed circuit substrate. The method includes controlling electric power delivered to a thermoelectric device using a thermoelectric management controller attached to the printed circuit substrate. The method includes supplying electric power to the thermoelectric device from a power connection attached to the printed circuit substrate. The thermoelectric device is configured to transfer thermal energy between a main surface and a waste surface upon application of electric power to the thermoelectric device. The main surface of the thermoelectric device is in physical contact with a bus bar. The bus bar is in thermal and electrical communication with an electrode of the battery cell. The electrode is configured to deliver electric power to or from the battery cell and to serve as a conduit for conducting thermal energy between a temperature-sensitive region of the battery cell and the thermoelectric device. The battery cell is capable of being heated or cooled by adjusting a polarity of electric current delivered to the thermoelectric device.

In some embodiments, the thermoelectric management controller is configured to control the polarity of electric current provided to the thermoelectric device, wherein a first polarity of electric current is provided in a cooling mode of system operation, and wherein a second polarity opposite the first polarity of electric current is provided in a heating mode of system operation.

In some embodiments, the battery management controller is configured to manage the charging and discharging of the battery cell.

In some embodiments, a temperature sensor in thermal communication with the battery cell and in electrical communication with the thermoelectric management controller is provided.

In some embodiments, the printed circuit substrate comprises a cutout portion configured to receive the thermoelectric device.

In some embodiments, a surface of the bus bar is in direct physical contact with a surface of the electrical conductor.

In some embodiments, a blower and duct assembly is attached to the printed circuit substrate and configured to push or pull air across the waste surface of the thermoelectric device. The blower and duct assembly comprises a controller in electrical communication with at least one of the battery management controller and thermoelectric management controller such that at least one of the battery management controller and thermoelectric management controller is configured to optimize system efficiency such that airflow from the blower is increased or decreased to match cooling or heating requirements of the battery cell.

In some embodiments, the bus bar comprises one or more mounting holes for mounting the bus bar to the printed circuit substrate and electrical conductor.

In some embodiments, the battery cell is sealed within an enclosure, the enclosure comprising a window abutting the thermoelectric device configured to provide access for substantial thermal communication between a portion of a waste heat removal system positioned outside the window and the waste surface of the thermoelectric device.

In some embodiments, thermoelectric devices are attached to both a top and bottom surface of the bus bar.

In certain embodiments, a method of manufacturing a thermoelectric battery thermal management system is provided that includes connecting a printed circuit substrate to a battery management system configured to control charging and discharging of a battery cell and to a thermoelectric management system configured to control electric power delivered to a thermoelectric device. The thermoelectric device is configured to transfer thermal energy between a main surface and a waste surface upon application of electric power to the thermoelectric device. The method includes attaching the main surface of the thermoelectric device to a bus bar and connecting the bus bar to an electrical conductor that is in thermal and electrical communication with the battery cell. The electrical conductor is configured to deliver electric power to or from the battery cell such that the electrical conductor serves as a conduit for conducting thermal energy between a temperature-sensitive region of the battery cell and the thermoelectric device. The method includes connecting a power connection positioned on the printed circuit substrate to the thermoelectric device for supplying electric power to the thermoelectric device.

In some embodiments, the method includes connecting a controller with the thermoelectric management system, wherein the controller is configured to control a polarity of electric current provided to the thermoelectric device. A first polarity of electric current is provided in a cooling mode of system operation and wherein a second polarity opposite the first polarity of electric current is provided in a heating mode of system operation.

In some embodiments, the method includes connecting a controller with the battery management system configured to administer control functions to the battery cell.

In some embodiments, the method includes connecting a temperature sensor in thermal communication with the battery cell and in electrical communication with the thermoelectric management controller.

In some embodiments, the method includes forming a cutout in the printed circuit configured to receive the thermoelectric device.

In some embodiments, the method includes connecting the bus bar to the electrical conductor such that a surface of the bus bar is in direct physical contact with a surface of the electrical conductor.

In some embodiments, the method includes attaching a blower and duct assembly to the printed circuit substrate, the blower and duct assembly configured to push or pull air across the waste surface of the thermoelectric device. The blower and duct assembly comprises a controller in electrical communication with at least one of the battery management system and thermoelectric management system such that at least one of the battery management system and thermoelectric management system is configured to optimize system efficiency such that airflow from the blower is increased or decreased to match cooling or heating requirements of the battery cell.

In some embodiments, the method includes mounting the bus bar to the printed circuit substrate and electrical conductor.

In some embodiments, the method includes sealing the battery cell within an enclosure, the enclosure comprising a window abutting the thermoelectric device configured to provide access for substantial thermal communication between a portion of a waste heat removal system positioned outside the window and the waste surface of the thermoelectric device.

In some embodiments, the method includes attaching thermoelectric devices to both a top and bottom surface of the bus bar.

BRIEF DESCRIPTION OF THE DRAWINGS

Various embodiments are depicted in the accompanying drawings for illustrative purposes, and should in no way be interpreted as limiting the scope of the thermoelectric assemblies or systems described herein. In addition, various features of different disclosed embodiments can be combined with one another to form additional embodiments, which are part of this disclosure. Any feature or structure can be removed, altered, or omitted. Throughout the drawings, reference numbers may be reused to indicate correspondence between reference elements.

DETAILED DESCRIPTION OF CERTAIN EMBODIMENTS

Figure 1:
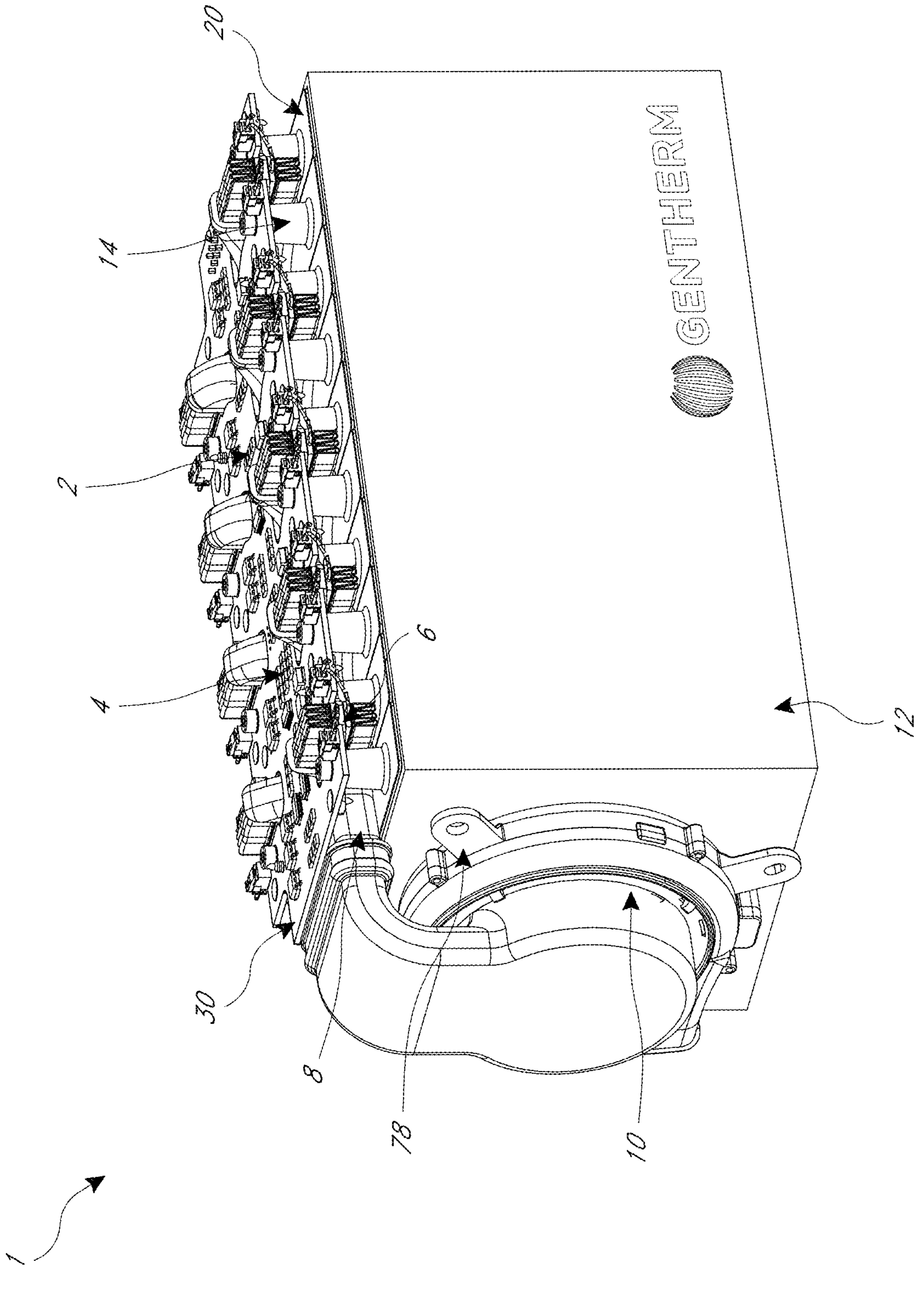
FIG. 1 schematically illustrates a perspective view of an example thermoelectric battery thermal management system.

Although certain embodiments and examples are disclosed herein, the subject matter extends beyond the examples in the specifically disclosed embodiments to other alternative embodiments and/or uses, and to modifications and equivalents thereof. Thus, the scope of the claims appended hereto is not limited by any of the particular embodiments described below. For example, in any method or process disclosed herein, the acts or operations of the method or process may be performed in any suitable sequence and are not necessarily limited to any particular disclosed sequence. Various operations may be described as multiple discrete operations in turn, in a manner that may be helpful in understanding certain embodiments; however, the order of description should not be construed to imply that these operations are order dependent. Additionally, the structures, systems, and/or devices described herein may be embodied as integrated components or as separate components. For purposes of comparing various embodiments, certain aspects and advantages of these embodiments are described. Not necessarily all such aspects or advantages are achieved by any particular embodiment. Thus, for example, various embodiments may be carried out in a manner that achieves or optimizes one advantage or group of advantages as taught herein without necessarily achieving other aspects or advantages as may also be taught or suggested herein.

It can be advantageous to manage the thermal conditions of electronics and electrical devices. Such thermal management can reduce incidences of overheating, overcooling, and electrical device degradation. Certain embodiments described herein provide thermal management of devices that carry significant electric power and/or require high current and efficiency (e.g., power amplifiers, transistors, transformers, power inverters, insulated-gate bipolar transistors (IGBTs), electric motors, high power lasers and light-emitting diodes, batteries, and others). A wide range of solutions can be used to thermally manage such devices, including convective air and liquid cooling, conductive cooling, spray cooling with liquid jets, thermoelectric cooling of boards and chip cases, and other solutions. At least some embodiments disclosed herein provide at least one of the following advantages compared to existing techniques for heating or cooling electrical devices: higher power efficiency, lower or eliminated maintenance costs, greater reliability, longer service life, fewer components, fewer or eliminated moving parts, heating and cooling modes of operation, other advantages, or a combination of advantages.

In electrical devices, typically electrically active portions and/or temperature sensitive regions of the device are connected to the outside world, such as, for example, external circuits or devices, via electrical conductors. For example, electrodes of a battery cell can be designed to carry high electric power without significant losses (e.g., heat losses that are proportional to the square of the current, per Joule's Law). The wire gauge of the electrical conductors used for such electrodes is commensurate with the high current that typically flows in such devices. The larger the size of the battery is, the bigger are the electrode posts for connection with the outside circuits.

The high electrical conductance of electrodes and many other types of electrical conductors also means that such conductors typically have high thermal conductivity. The high thermal conductivity can be used to solve various thermal management problems, where one can deliver desired thermal power (e.g., cooling, heating, etc.) directly to the sensitive elements of the device by heating and/or cooling the electrodes, bypassing thermally-insensitive elements of the device. Similar to using thermally conditioned blood during blood transfusions for delivering heat deep to the core of human bodies, heat pumping through the electrodes can be used to efficiently deliver desired thermal conditions deep inside an electrical device. As an example, it has been determined that electrode cooling of advanced automotive batteries is one of the most advantageous techniques for battery thermal management. For example, the electrodes can be cooled using solid, liquid, or air cooling techniques. In a sense, electrodes act as cold fingers in such a thermal management arrangement.

Embodiments disclosed herein include systems and methods capable of thermally managing an electrical device by applying direct or indirect thermoelectric (TE) cooling and/or heating to current carrying electrical conductors (e.g., electrodes) of power components, electronics, and other electrical devices. Such devices can often benefit from thermal management. Some embodiments will be described with reference to particular electrical devices, such as, for example, batteries, battery modules, and/or battery cells. However, at least some embodiments disclosed herein are capable of providing thermal management to other electrical devices, such as, for example, insulated-gate bipolar transistors (IGBTs), other electrical devices, or a combination of devices. At least some such devices can have high current carrying capacity and can suffer from operation outside of a preferred temperature range. The operation of some embodiments is described with reference to a cooling mode of operation. However, some or all of the embodiments disclosed herein can have a heating mode of operation, as well. In some situations a heating mode of operation can be employed to maintain the temperature of an electrical device above a threshold temperature, under which the electrical device may degrade or exhibit impaired operation. TE devices are uniquely suited to provide both heating and cooling functions with minimum complications for system architecture.

There are a variety of ways in which TE devices can be used for electrical conductor cooling and/or heating tasks. As described herein, TE devices can include one or more TE elements, TE materials, TE assemblies and/or TE modules. In some embodiments, a TE system can include a TE device, which comprises a first side and a second side opposite the first side. In some embodiments, the first side and second side can be a main surface and waste surface or heating/cooling surface and waste surface, respectively. A TE device can be operably coupled with a power source. The power source can be configured to apply a voltage to the TE device. When voltage is applied in one direction, one side (e.g., the first side) creates heat while the other side (e.g., the second side) absorbs heat. Switching polarity of the circuit creates the opposite effect. In a typical arrangement, a TE device comprises a closed circuit that includes dissimilar materials. As a DC voltage is applied to the closed circuit, a temperature difference is produced at the junction of the dissimilar materials. Depending on the direction (e.g., polarity) of the electric current/voltage, heat is either emitted or absorbed at a particular junction. In some embodiments, the TE device includes several solid state P- and N-type semi-conductor elements connected in series and/or parallel electrical communication. In certain embodiments, the junctions are sandwiched between two electrical isolation members (e.g., ceramic plates), which can form the cold side and the hot side of the TE device. The cold side can be thermally coupled to an object (e.g., electrical conductor, electrical device under thermal management, etc.) to be cooled and the hot side can be thermally coupled to a heat sink which dissipates heat to the environment. In some embodiments, the hot side can be coupled to an object (e.g., electrical conductor, electrical device under thermal management, etc.) to be heated. Certain non-limiting embodiments are described below.

The term "substantial thermal communication" is used herein in its broad and ordinary sense and includes, for example, snug contact between surfaces at the thermal communication interface; one or more heat transfer materials or devices between surfaces in thermal communication; a connection between solid surfaces using a thermally conductive material system, wherein such a system can include pads, thermal grease, paste, one or more working fluids, or other structures with high thermal conductivity between the surfaces; other suitable structures; or a combination of structures. Substantial thermal communication can take place between surfaces that are directly connected or indirectly connected via one or more interface materials.

In some embodiments, it can be beneficial to provide thermal management (either heating and/or cooling) to an electrical device to promote efficient operation of the electrical device. For example, heating and cooling an electrical device (e.g. a battery, battery pack, battery module(s), cells of a battery pack or module, etc.) through electrical conductors (e.g., battery or cell electrodes) can be an efficient way to perform such thermal management. One option to provide distributed and agile thermal management to the cells in a battery pack is to control the flow of heat in and out of the battery by putting thermoelectric devices in substantial thermal communication with one or more battery electrodes as described in certain embodiments herein.

Many types of modern rechargeable batteries (e.g., hybrid vehicle batteries, Lithium-Ion batteries, smart batteries) are configured to charge and discharge at varying or different rates depending on temperature, charge states, and other conditions. These types of batteries can include a controller that varies the electric current or voltage added to or drawn from the battery during charging and/or discharging. The controller can regulate the electric charging and/or discharging based on the state of the battery. The same controller or a different controller can manage other aspects of the battery, such as cell balancing, environment control, safe operating area protection, data gathering, calculation, and reporting, and so forth. A system that includes one or more controllers that manage these aspects of a battery's operation can be called a battery management system (BMS). The BMS can monitor the state of the battery and environmental conditions to protect the battery from damage, extreme temperatures, and/or conditions that degrade battery performance. The BMS can include one or more controllers, sensors (e.g., thermistor, thermocouple), processors, integrated circuits, external communication data buses, voltage converter, regulator circuit, voltage tap, printed circuit substrates (e.g., printed circuit boards or flexible printed circuits) (PCSs) for monitoring temperature, voltage, state of charge or discharge, state of health, energy capacity and/or current of the battery or battery cells and other environmental conditions.

When these types of batteries or battery modules are cooled or heated using thermoelectric devices, they can be operatively connected to a thermoelectric-based thermal management system (TMS). The BMS and TMS of such batteries can be separate or discrete systems (e.g., the BMS and TMS controllers may be located on different PCSs). In some embodiments, a battery or battery module includes an integrated BMS and TMS (e.g., the BMS and TMS controllers can be located within the battery enclosure and/or on the same PCS).

FIG. 1 illustrates a schematic of an example thermoelectric battery thermal management system (TBTMS) 1 configured for cooling and/or heating electrical devices that can comprise or incorporate features and aspects, in whole or in part, of any of the embodiments, features, structures and operating modes discussed herein. In some embodiments, a TBTMS 1 can comprise an integrated battery management system 2 (BMS), an integrated thermoelectric management system 4 (TMS), one or more integrated bus bars 6, and an integrated air duct 8 and blower 10 system configured to provide heating and/or cooling to a battery module 12 (as a whole and/or to individual cells or specific portions of the module as desired) via one or more electrical conductors 14 (e.g., electrodes). In some embodiments, the air duct 8 can be configured to have fluids other than air (e.g., liquid, gas, etc.) flow therethrough. In some embodiments, the TBTMS 1 can comprise at least one TE device 16 in substantial thermal communication with a heat exchange surface of at least one electrical conductor 14 (e.g., a current carrying connector, an electrode, portion of a cell, terminal wires, wiring between electrodes or portions of cells, leads, positive and/or negative terminals, etc.) of the battery module 12 via one or more integrated bus bars 6 as described further below. One or more of the components of the TBTMS 1 can be integrated with a printed circuit substrate (PCS) 30 for controlling and monitoring various conditions of the battery module 12 and/or to be supplied with power (e.g., voltage, current, etc.) by the battery module 12 as described in more detail below.

In some embodiments, the TE device 16 is configured to transfer thermal energy between a main surface or side and a waste surface or side of the thermoelectric device upon application of electric power (e.g., voltage and/or current) to the TE device 16. Either, the main or waste surface of the thermoelectric device 16 can be configured to be in substantial thermal communication with one or more electrical conductors 14. The one or more electrical conductors 14 are configured to deliver electric power to or from the cells of the battery module 12. The electrical conductors 14 are operable to serve as conduits for conducting thermal energy between the temperature-sensitive region of the cells of the battery module 12 and the thermoelectric devices 16

In such instances, the one or more electrical conductors 14 are capable of conducting both electrical energy and thermal energy between temperature-sensitive regions of the battery module 12 and one or more external devices. When operated in a cooling mode, heat Q is pumped from the one or more electrical conductors 14 and dissipated into the outside environment, which can be air, liquid, another solid component, or a combination of components. When operated in the heating mode, the thermal power will be pumped in the reverse direction, delivering the heat into the battery module 12 through the one or more electrical conductors 14.

With reference to FIG. 1, in some embodiments, the battery module 12 of the TBTMS 1 can comprise multiple cells 20 electrically connected with one another to provide a single functional battery module 12. In some embodiments, multiple battery modules 12 (e.g., two or more) can be assembled together to be in electrical communication either in series and/or parallel. In some embodiments, one or more battery modules 12 can be positioned or stacked adjacent and/or on top of each other. As illustrated in FIG. 1, in some embodiments, the battery module 12 comprises 10 individual cells 20 electrically connected in series. In some embodiments, individual cells 20 of the battery module 12 can be electrically connected together in series and/or parallel via electrically conductive bus bars 6 or other connectors or conductors. In some embodiments, the thermal management system 4 can include one or more thermoelectric devices 16 integrated with or connected to (e.g., in substantial thermal communication with) one or more electrical conductors 14 of one or more cells 20 of the battery module 12 via one or more bus bars 6.

As illustrated in FIG. 1, in one embodiment, the cells 20 connected in series can have two parallel rows of electrical conductors 14 that extend along a top surface of the battery module 12. In some embodiments, the one or more thermoelectric devices 16 can be configured to have copper substrates or foils 22 layered on top and bottom surfaces of a ceramic substrate 24 or any other suitable configuration or material. In some embodiments, one side or portion of each thermoelectric device 16 can be connected to, attached, or integrated with (e.g., soldered, clipped, adhered, bonded, clamped, or otherwise attached) at least one integrated bus bar 6. As illustrated in FIG. 1, in some embodiments, a first side of a first thermoelectric device 16 can be connected to or integrated with a top surface of a bus bar 6 and a first side of a second thermoelectric device 16 can be connected to or integrated with a bottom surface of a bus bar 6.

In some embodiments, the at least one integrated bus bar 6 is coupled to one or more electrical conductors 14 of two or more cells 20 (e.g., two adjacent cells that are connected in series) such that the thermoelectric device 16 is in substantial thermal communication with the one or more electrical conductors. In some embodiments, at least one electrical conductor 14 is not in substantial thermal communication with or connected to at least one TE device 16. A second side or portion of each thermoelectric device 16 can be connected, soldered, clipped, adhered, bonded, clamped, or otherwise attached to at least one heat transfer device 26. The at least one heat transfer device 26 (e.g., a heat exchanger) can comprise fins 28. In some embodiments, one heat transfer device 26 can be attached to each thermoelectric device 16. In other embodiments, multiple heat transfer devices 26 can be attached to or in substantial thermal communication with each thermoelectric device 16. The heat transfer device 26 can be in thermal communication with any waste removal system as described below (e.g., liquid loop or conduit, duct and blower).

In some embodiments, a TBTMS 1 is provided that is configured to be integrated with existing componentry, cells, and/or circuitry of an electrical device (e.g., electric vehicle battery or battery module 12) and the electrical device's control or management system that monitors discharge/charge rate, temperature, or other conditions of the electrical device (e.g., BMS 2 and/or TMS 4). Such an integrated TBTMS 1 can ease assembly or installation issues, minimize components or complications involved with such systems. In some embodiments, one or more components can be integrated with a single existing or required component (e.g., PCS 30) prior to attachment of the single component to the electrical device, to ease assembly and/or installation. As illustrated in FIG. 1, the TBTMS 1 of a battery module 12 can comprise both a TMS 4 and BMS 2 of the battery module 12, one or more bus bars 6, one or more thermoelectric devices 16, one or more heat transfer devices 26, and air duct 8 and blower system 10 configured to be integrated to one or more components, for example, the PCS 30. Once the one or more components are installed onto and integrated with the PCS 30 (e.g., connected or in electrical communication), the PCS can then be coupled to the battery module 12. In such instances, the TBTMS 1 would then only need an electrical connection (e.g., the battery module 12 itself or an external power source) to the various systems or components (e.g., BMS 2, TMS 4, TE devices 16, etc.) to provide power to those components. These types of systems or assemblies can decrease the complexities, components, difficulties, steps, and/or costs associated with manufacturing, installation, and/or assembly of such systems.

In some embodiments, the TBTMS 1 comprises the BMS 2 and the TMS 4 integrated on the PCS 30 (e.g., the PCS 30 connects the BMS 2 to the TMS 4 or the BMS 2 and the TMS 4 share a PCS and/or integrated circuits). The BMS 2 is configured to control the charging and discharging of the battery module 12. The TMS 4 can include a controller (e.g., ECU) configured to control the power (e.g., current, voltage) delivered to the one or more TE devices 16. The TE devices 16 can include a main side and a waste side. The main side can be the side of the TE device 16 where the temperature is controlled. The waste side can be the side of the TE device 16 that serves as a heat source or heat sink for the TMS 4. In some embodiments, the TMS 4 does not control the temperature of the heat source or the heat sink connected to the waste side of the TE device 16. The main sides of the TE devices 16 can be in substantial thermal communication (e.g., direct or indirect physical contact or attachment) with a bus bar 6. As further described below, each bus bar 6 can be in substantial thermal communication (e.g., direct or indirect physical contact or attachment) with a heat exchange surface of one or more electrical conductors 14 (e.g., a current carrying connector, electrode, portion of a cell, terminal wires, wiring between electrodes or portions of cells, leads, etc.) of a battery cell, pack or module 12. Additionally, as described below, the PCS 30 can include a power connection (e.g., electrical connectors 50 configured to supply power from the electrical device under thermal management (e.g., battery module 12) or an external device or source of power) to the TE device 16. For example, the TE device 16 can be "plugged" into the electrical connector 50 positioned on the PCS 30.

As shown in FIG. 1 and discussed above, in some embodiments, a TMS 4 can include at least one TE device 16. A surface (e.g., main side) of the TE device 16 can be in substantial thermal communication with or attached to a surface of a bus bar 6. A surface of the bus bar 6 can be in direct or indirect contact with a solid surface of at least one electrical conductor 14. The electrical conductor 14 can be configured to deliver electric power to a cell of the battery module 12 such that the electrical conductor 14 also serves as a conduit for conducting thermal energy between temperature-sensitive regions in the cell of the battery module 12 and the TE device 16. In some embodiments, the interface between the surface of bus bar 6 and solid surface of the electrical conductor 14 can include a thermally conductive material (not shown) configured to facilitate substantial thermal communication between the surfaces. For example, the thermally conductive material can include grease, paste, pads, material with high thermal conductivity, material with thermal conductivity greater than or equal to about 100 W/(m×K), another suitable material, or a combination of materials. In some embodiments, a thermally conductive material can be positioned at an interface between one or more surfaces of a thermal transfer device or bus bar and surfaces of a TE device and/or electrical conductor.

As described above, a controller (e.g., ECU) can be provided as part of the TMS 4 to control the TE device 16 to perform either a heating or cooling function and/or adjust the electric power delivered to the TE device 16. The TE device 16 can be powered in-line with the device under thermal management (e.g., battery module 12) or via an external power supply or source. In some embodiments, TE devices 16 are electrically powered and controlled to perform their heat pumping function to and/or from a device under thermal management. The power and control function can be performed by a separate electronic control unit, ECU. The ECU can adjust the electric power delivered to the TE device 16 associated with the TE management of the battery module 12. In some embodiments, the ECU takes inputs from one or more temperature sensors that sense the thermal condition of the battery module 12 directly or via electrical conductors 14, compares them to algorithms and issues a controlling signal for the TE device 16 to perform either a heating or cooling function. In some embodiments, the ECU can be configured to take inputs other than temperature (e.g., the current or voltage pushed in and/or out to the TE device 17 and/or battery module 12, etc.) from other sensors (not shown) and adjust the cooling and/or heating output to/from the battery module 12. The TMS 4 may be integrated with the rest of the electronics supporting the battery module 12 under thermal management. For example, the BMS 2, which is configured to monitor the health of the battery and/or administer control functions in response to internal and/or external changes. The TMS 4 functionality can be integrated into the BMS 2 and can be co-located on the same PCS 30 or using the same chipsets or integrated circuits that perform BMS 2 functions.

Figure 2:
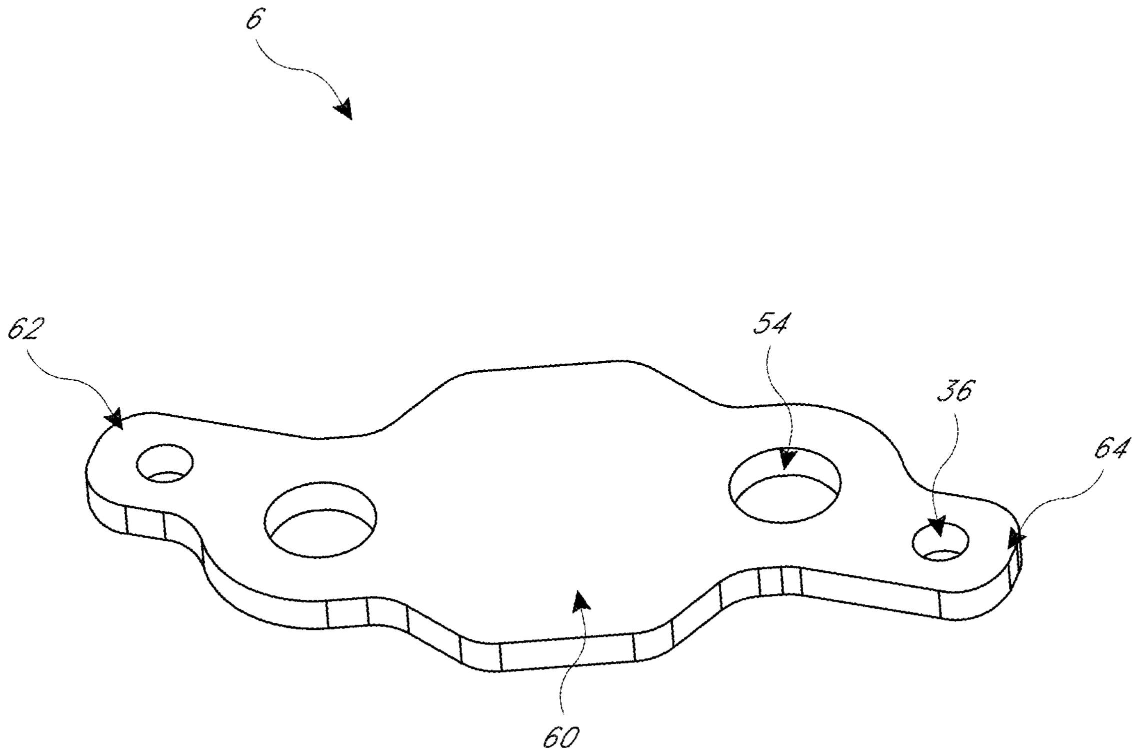
FIG. 2 illustrates a perspective view of an example bus bar of a thermoelectric battery thermal management system.
Figure 3:
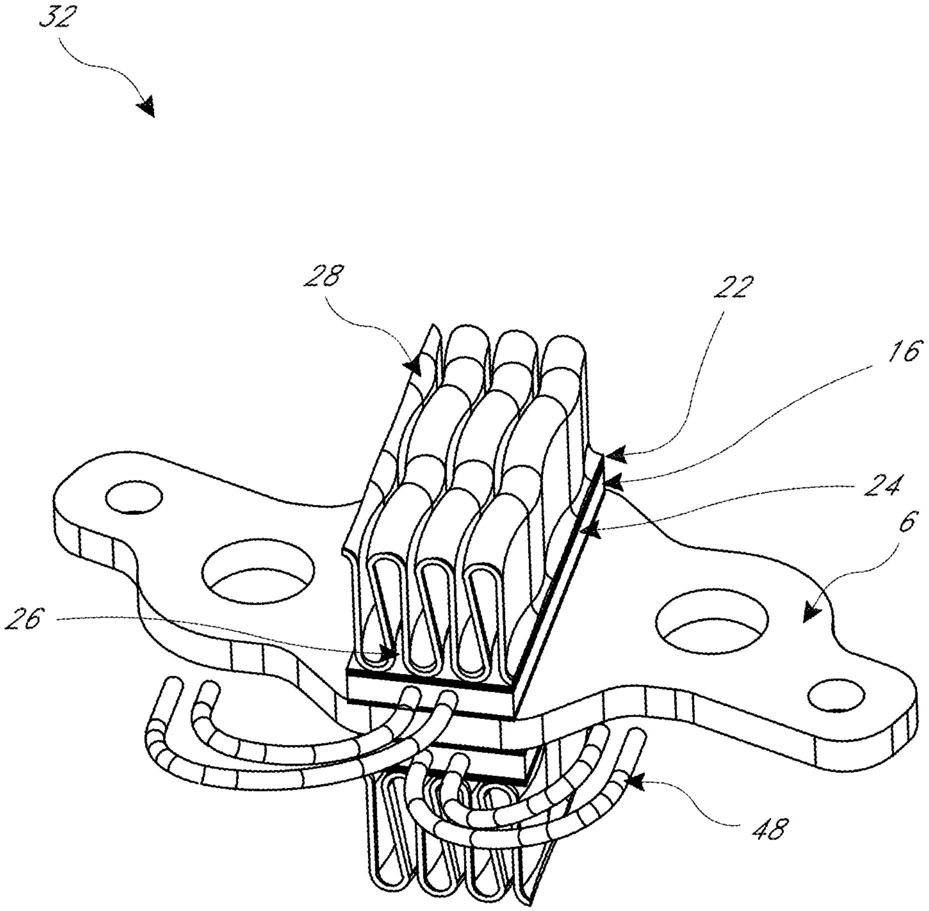
FIG. 3 illustrates a perspective view of an example thermoelectric module having a thermoelectric device attached to the bus bar of FIG. 2.
Figure 4:
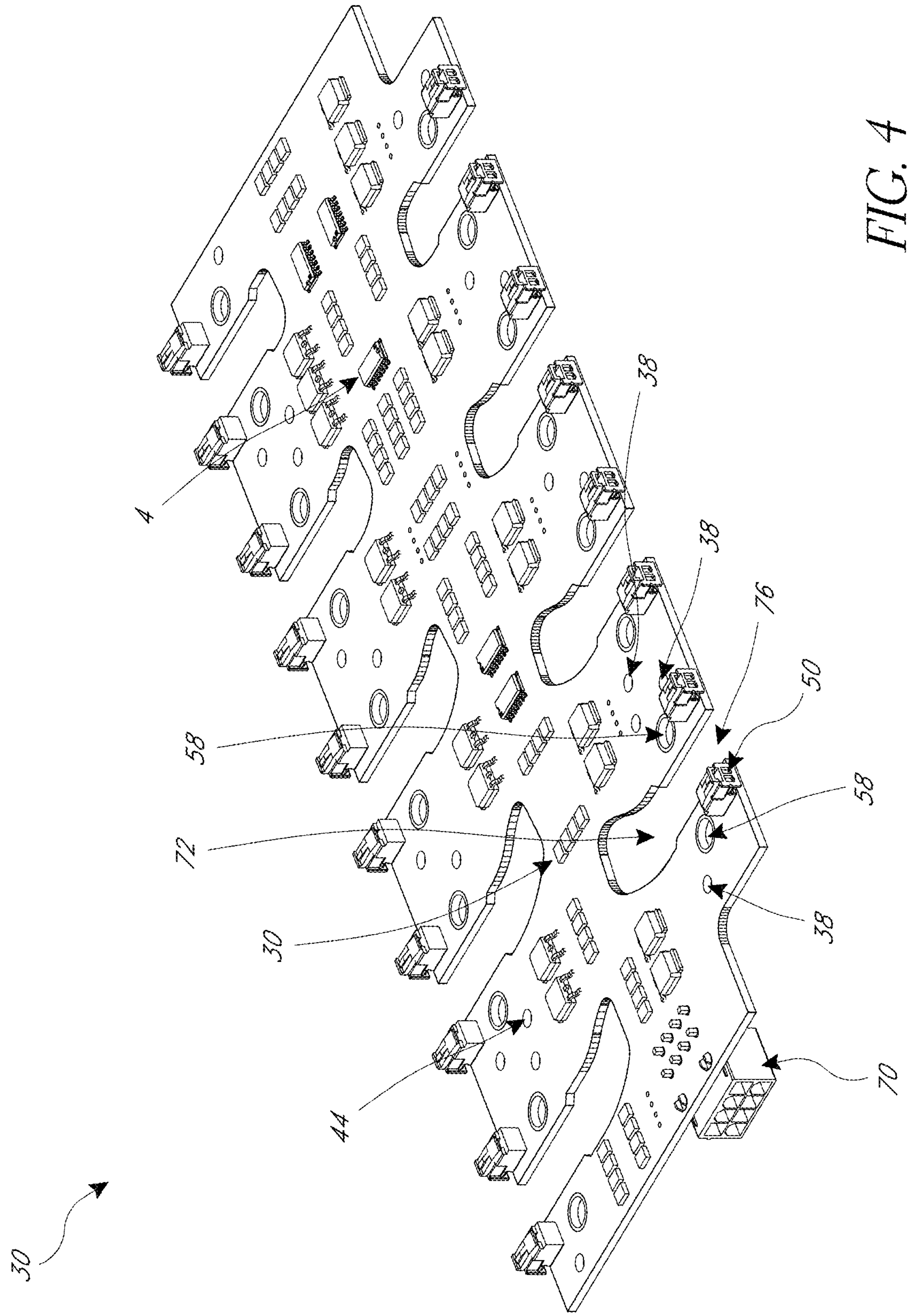
FIG. 4 illustrates a perspective view of an example printed circuit substrate.

With reference to FIGS. 2-11, example embodiments of assembling one or more components onto the battery module 12 to form the example TBTMS 1 illustrated in FIG. 1 can comprise at least one or more steps comprising the steps of manufacturing (e.g., stamping out) one or more bus bars 6 as illustrated in FIG. 2. The bus bars 6 can comprise other features and configurations as described further below. Another step comprises forming a thermoelectric module 32 by attaching (e.g., soldering, etc.) a first side (e.g., main side) of one or more thermoelectric devices 16 to a top and/or bottom surface of one or more bus bars 6 as illustrated in FIG. 3. A second side (e.g., waste side) of the TE devices 16 can be attached to a heat transfer device 26 (e.g., fin, heat exchanger) as described above. The TE module 32 can comprise other features as described further below. Another step comprises assembling and/or manufacturing the PCS 30 with an integrated BMS 2 and TMS 4 as illustrated in FIG. 4. The PCS 30 can comprise other features as described further below.

Figure 6:
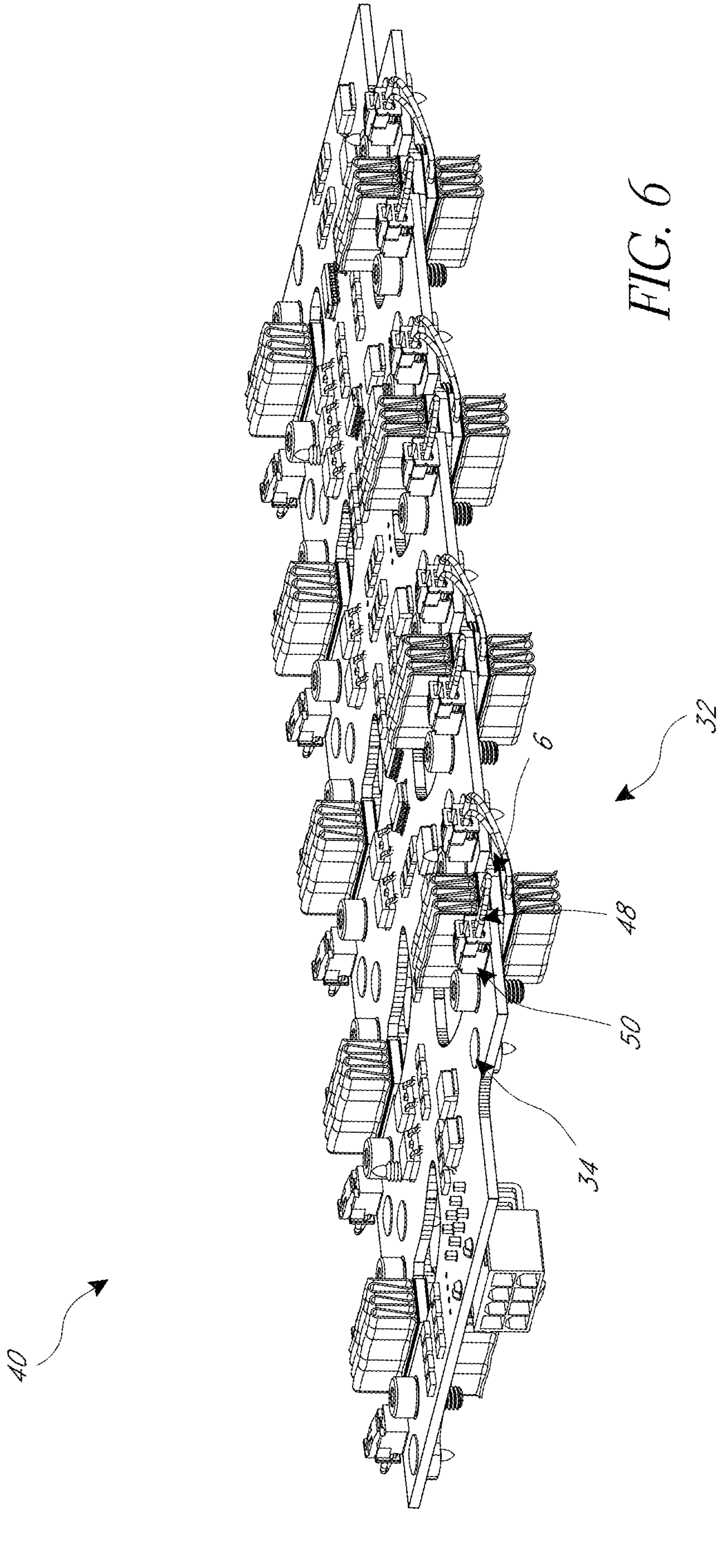
FIG. 6 illustrates a perspective view of an example assembly of the one or more thermoelectric modules of FIG. 3 attached to the printed circuit substrate of FIG. 4.

In another step, an engagement feature 34 (e.g., push pin, screw, nail, bolt, ultrasonic stake, rivet, etc.) can be used to secure the TE module 32 of FIG. 3 to the PCS 30 of FIG. 4 to form the assembly 40 in FIG. 6. In some embodiments, as illustrated in FIG. 6, one or more engagement features 34 secure or assemble one or more portions of each bus bar 6 to a bottom surface or underside of the PCS 30 via mounting holes or cut-outs 36 in the bus bar 6 and corresponding mounting holes or cut-outs 38 in the PCS 30. The engagement features 34 can comprise push pins configured to be inserted into or extend through the mounting holes or cut-outs 36, 38 configured to be aligned to secure the bus bar 6 to the PCS 30. The engagement features 34 can comprise other features as described further below. The TE modules 32 can be supplied with power (e.g., current, voltage, etc.) by or through the PCS 30 via connecting cables or wires 48 attached to the TE devices 16 and to one or more electrical connectors 50 on the PCS 30. The electrical connectors 50 can be configured to supply power from the electrical device under thermal management (e.g., battery module 12) or an external device or source of power.

Figure 7:
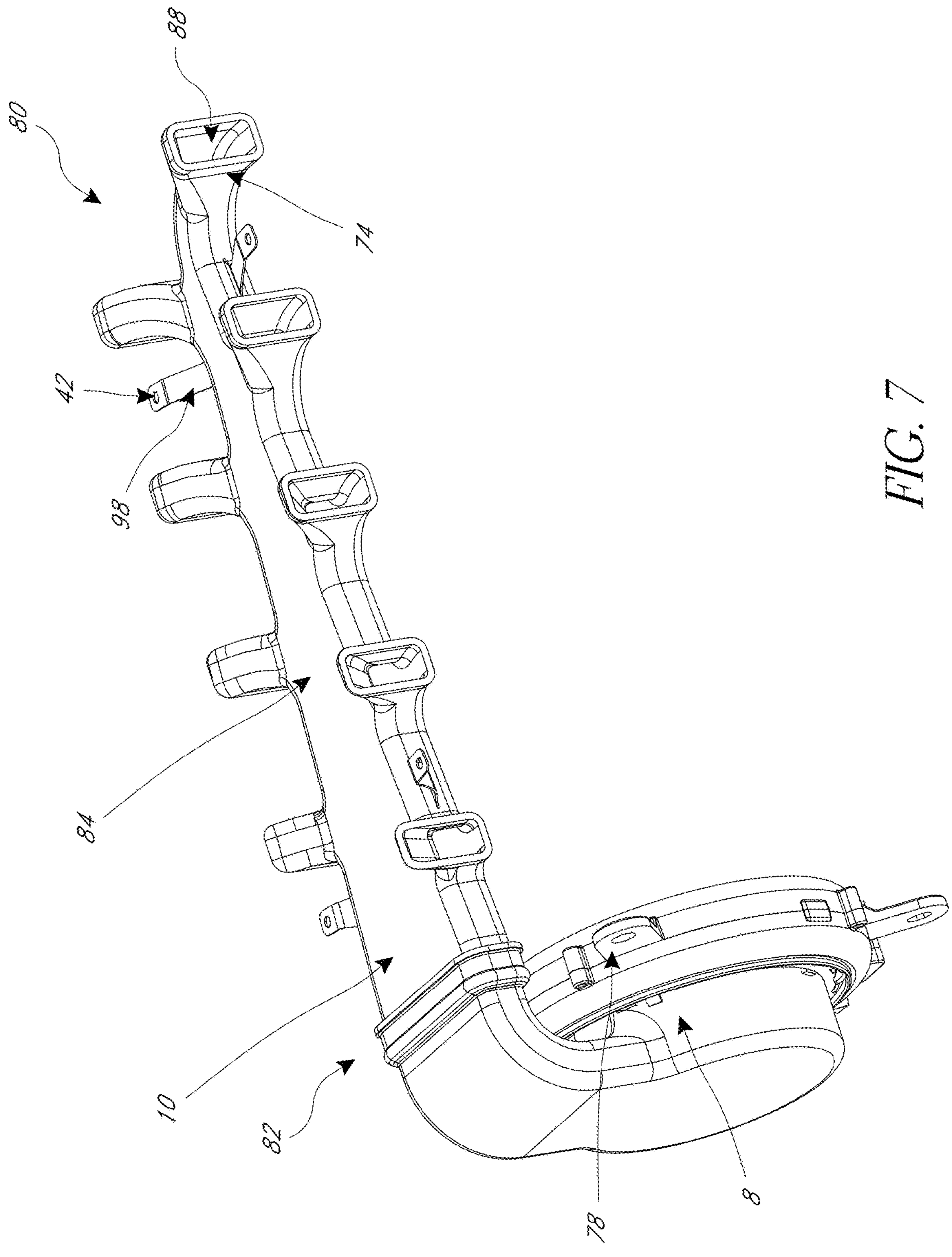
FIG. 7 illustrates a perspective view of an example air duct and blower system.
Figure 8:
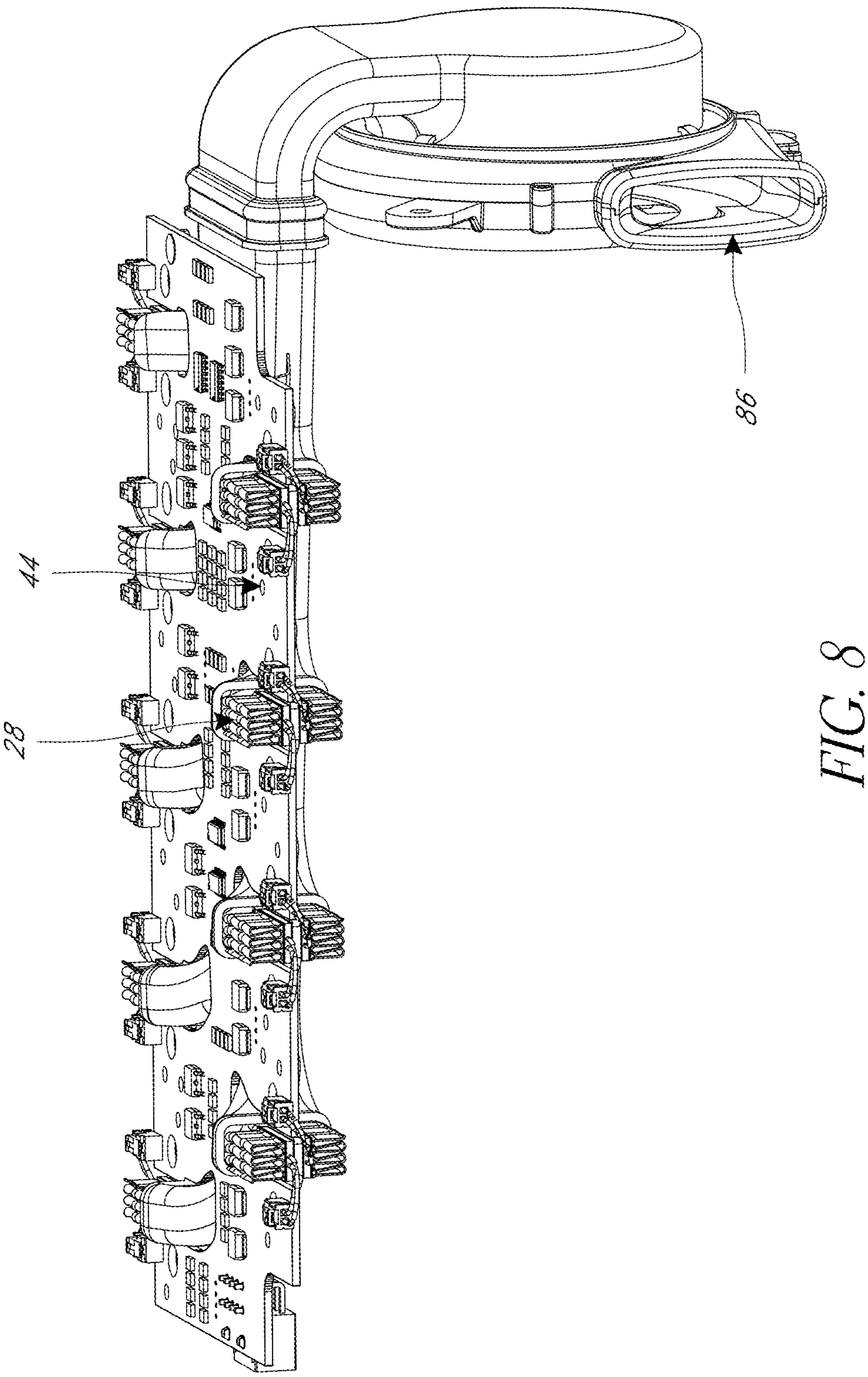
FIG. 8 illustrates a perspective view of the example air duct and blower system of FIG. 7 attached to the assembly of FIG. 6.
Figure 9:
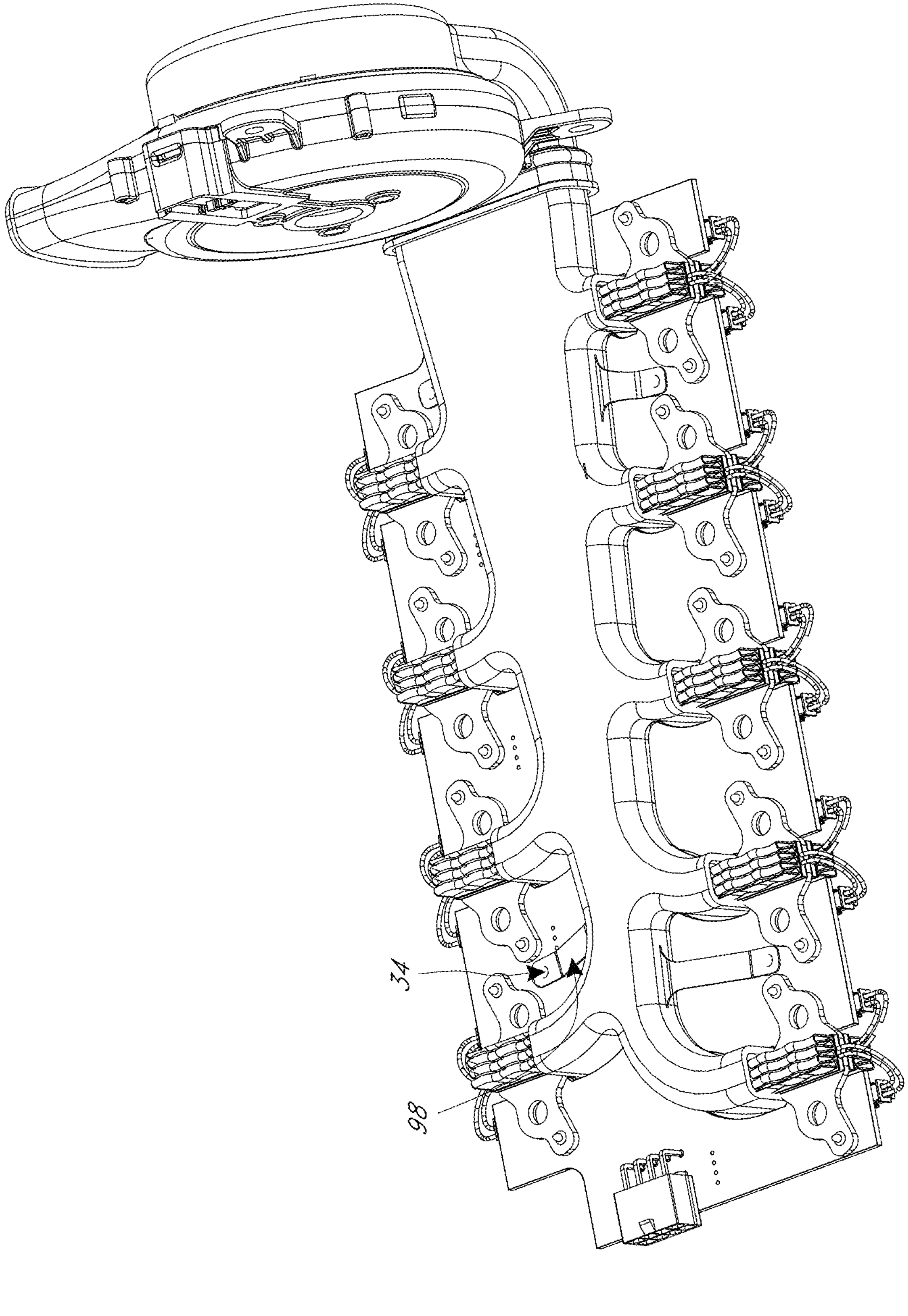
FIG. 9 illustrates a bottom perspective view of the example assembly of FIG. 8 with the example air duct and blower system attached to the printed circuit substrate via one or more engagement features.
Figure 10:
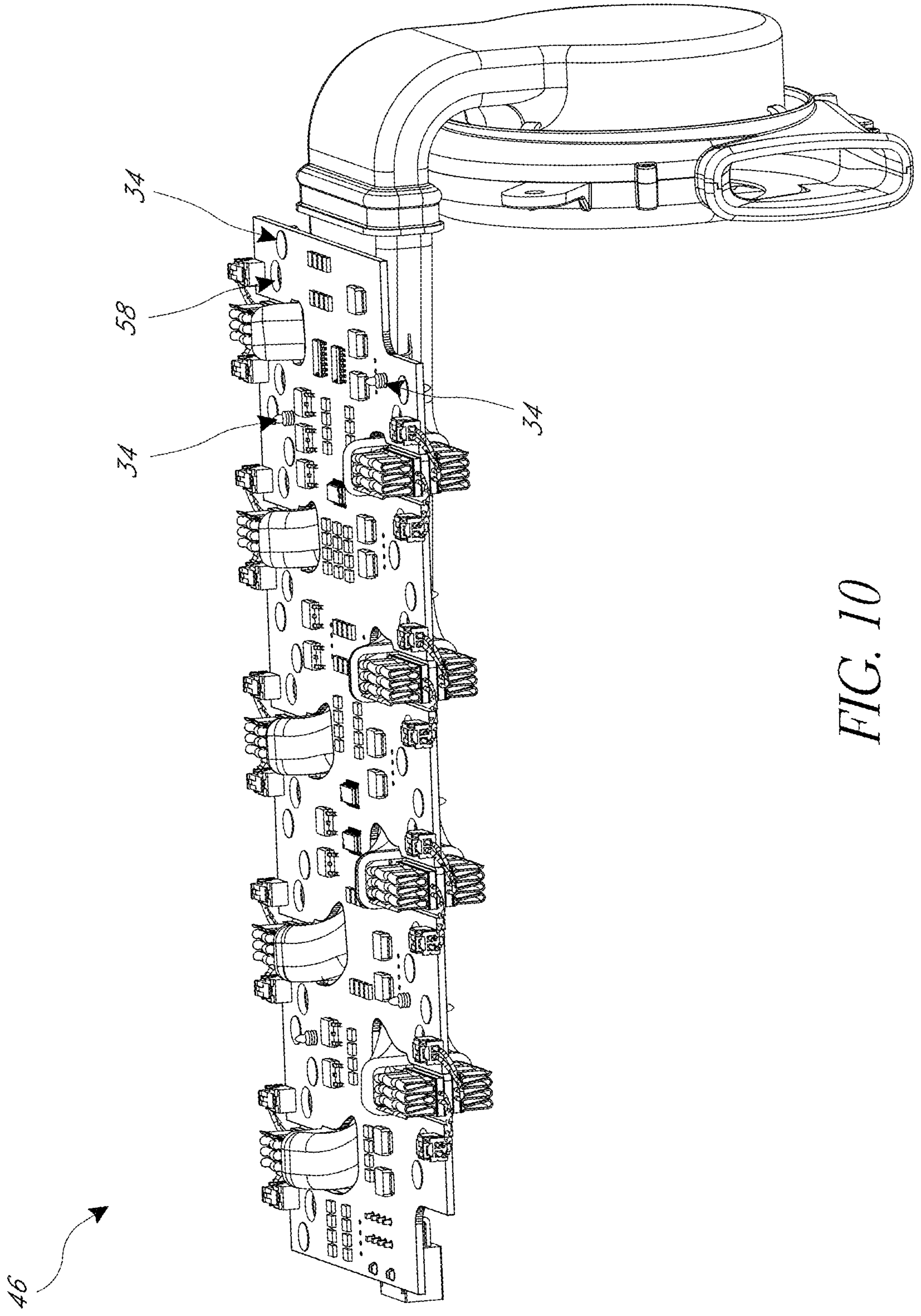
FIG. 10 illustrates a top perspective view of the example assembly of FIG. 9.

In another step, an air blower 8 can be assembled to a duct system 10 as illustrated in FIG. 7. The air blower 9 and duct system 10 can then be assembled to the assembly 40 illustrated in FIG. 6 as shown in FIG. 8. The air blower 8 and duct system 10 can comprise other features as described further below. In some embodiments, as illustrated in FIG. 9, the air blower 8 and duct system 10 can be secured to the bottom surface of the PCS 30 of assembly 40 via engagement features 34 configured to be inserted into or extend through corresponding mounting holes or cut-outs 42 of the attachment structure 98 of the duct system 10 and mounting holes or cut-outs 44 of the PCS 30 that are configured to be aligned, which results in the assembly 46 as illustrated in FIG. 10. In other embodiments, the air blower 8 and duct system 10 can be secured to the top surface of the PCS 30 of assembly 40.

Figure 11:
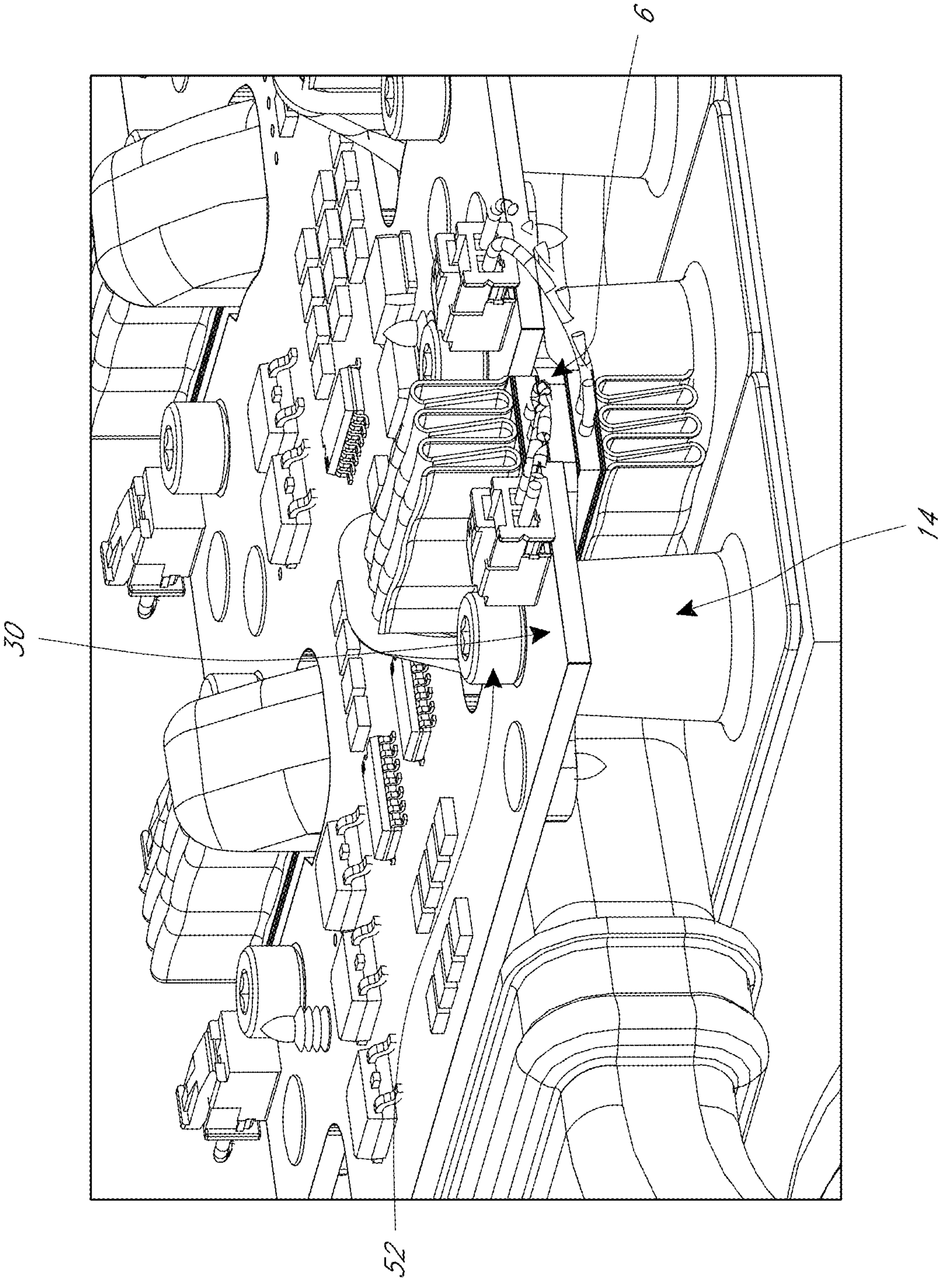
FIG. 11 illustrates a partial view of the example assembly of FIG. 10 attached to a battery module.

In some embodiments, the assembly 46 comprising the PCS 30 integrated or assembled with one or more thermoelectric modules 32, the TMS 4, BMS 2, and the air blower 8 and duct system 10 can then be assembled and secured onto the electrical conductors 14 to form the TBTMS 1 illustrated in FIG. 1. As illustrated in FIG. 11, each bus bar 6 of the assembly 46 can be mounted simultaneously to one or more electrical conductors 14 and the PCS 30. In some embodiments, one or more mounting holes or cut-outs 54 of each bus bar 6 is configured to be aligned with one or more mounting holes or cut-outs 56 of the electrical conductors 14 and one or more mounting holes or cut-outs 58 in the PCS 30. In some embodiments, the engagement features 52 (e.g., bolts, nuts, screws, push pins, ultrasonic stakes, rivets etc.) are configured to insert into or extend through the corresponding and aligned mounting holes or cut-outs 54, 56, and 58 to secure the bus bars 6 to the PCS 30 and electrical conductors 14. In some embodiments, the assembly 46 can be secured to the electrical conductors 14 such that the TE devices 16 are mounted between electrical conductors 14 positioned on adjacent cells 20. In some embodiments, one or more mounting holes or cut-outs 54 of each bus bar 6 is configured to be aligned with, mounted to or attached to the electrical conductors 14.

As illustrated in FIG. 2, the bus bars 6 can comprise various cross-sectional shapes (e.g., flat strips, hollow tubes, etc.) and materials (e.g., copper, brass, aluminum, etc.). In some embodiments, the bus bars 6 can comprise one or more mounting holes or cut-outs configured to be aligned with corresponding mounting holes or cut-outs of the PCS 30, duct system 10 and electrical conductors 14 to secure the components together as discussed above. The bus bars 6 can comprise first and second tabs at first and second ends, respectively with first and second mounting holes or cut-outs 36 configured to be aligned with mounting holes or cut-outs 38 of the PCS 30. The bus bars 6 can comprise first and second mounting holes or cut-outs 54 configured to be aligned with corresponding mounting holes or cut-outs 56 and 58 of the electrical conductors 14 and PCS 30 positioned inwardly and/or more proximal to the center of the bus bar than the mounting holes or cut-outs 36 positioned at the ends of the bus bar 6.

In some embodiments, the bus bars 6 can comprise an increased width in some areas configured to attach to TE devices relative to the areas of the bus bar 6 configured to attach to the electrical conductors 14. The bus bar 6 can taper in width from a center portion 60 to the first 62 and second ends 64 In some embodiments, maximizing the surface area of the bus bar 6 in a location configured for attachment to a TE device 16, improves thermal conductivity and/or management between the bus bar 6 and TE device 16. In some embodiments, such a TE device 16 attachment area of the bus bar 6 can comprise increased dimensions relative to other portions of the bus bar 6.

In some embodiments, the cross sectional shape of the bus bars 6 can comprise a configuration such that the bus bars 6 can be packaged or positioned closer together on the PCS 30 or battery module 12. For example, in FIG. 2, the bus bars 6 are configured to be non-symmetrical or angled such that the clearance required between a second end 64 of a first bus bar 6 and the first end 62 of an adjacent second bus bar 6 is minimized. In some configurations, the bus bars 6 are configured to be nested with adjacent bus bars. In some embodiments the mounting holes or cut-outs of the bus bar 6 are positioned at non-zero angles with respect to a center line of the bus bar 6.

As illustrated in FIG. 3 and discussed above, TE modules 32 can comprise at least one side of first and second TE devices 16 configured to be attached to a top surface and a bottom surface, respectively, of a bus bar 6. In some embodiments, only one of the top and bottom surfaces of the bus bar 6 is attached to a TE device 16. The TE devices 16 can be bonded to the bus bars 6 and/or heat transfer devices 26 via adhesives (e.g., epoxies, etc.). In other embodiments, the TE devices can be soldered to the respective heat transfer device or bus bar. In some embodiments, an interface layer (e.g., foam, thermal grease, etc.) can be provided between the TE device 16 and fins 28 and/or bus bars 6. Top and bottom cables or wires 48 can be attached to or in electrical communication with the first and second TE devices 16 respectively and to first and second electrical connectors 50 for supplying power to the top and bottom TE devices 16. In some embodiments, the PCS can comprise integrated controls for supplying power through the electrical connectors 50 so the wires 48 simply need to be connected to or plugged into the electrical connectors 50. Power can then be supplied through the battery module 12 or an external power source electrically connected to the PCS via connection 70. Heat transfer devices 26 comprising fins 28 can be attached to second sides of the TE devices 16. As illustrated in FIG. 1, these fins 28 can be positioned above and below the PCS 30. In some embodiments, TE devices 16 can be manufactured directly on the bus bars 6.

As illustrated in FIG. 4, the PCS 30 can comprise various apertures, holes, channels, or cut-outs configured to be aligned with mounting features or holes of other components as discussed above (e.g., electrical conductors 14, bus bars 6, and/or attachment structures 48 of duct system 10, etc.). The cut-outs can be sized and positioned on the PCS 30 such that the electrical conductors 14 (e.g., positive and/or negative terminals) have clearance on the PCS to be secured to the PCS.

The PCS can comprise a connector 70 configured for attachment to external power sources and/or other components (e.g., sensors or control systems). The PCS 30 can comprise one or more electrical connectors 50 configured to connect to wires 48 to supply power to TE devices 16.

One or more control management systems (e.g., TMS 4, BMS 2, air blower 8 controls, etc.) can be integrated with the PCS 30. The PCS 30 can be configured to be a "backbone" of assembly 46 for installing or assembling to battery module 12.

In some embodiments, as illustrated in FIG. 4, PCS 30 can comprise design features configured to provide spaces and/or enough clearance for different components to be integrated onto the PCS 30. For example, the PCS 30 can comprise cut-outs 72 (e.g., recesses, gaps) configured to provide clearance for outlets 74 of duct system 10 described further below. Other cut-outs 76 can be provided in the PCS 30 to provide clearance for TE devices 16 attached to the PCS 30. Such cut-outs 76 can be configured to be positioned between electrical conductors 14 such that the TE devices 16 can be positioned between electrical conductors 14. In some embodiments, these cut-outs have uniform cross sectional areas. In other embodiments, these cut-outs have non-uniform cross-sectional areas as illustrated in FIG. 4.

Figure 5:
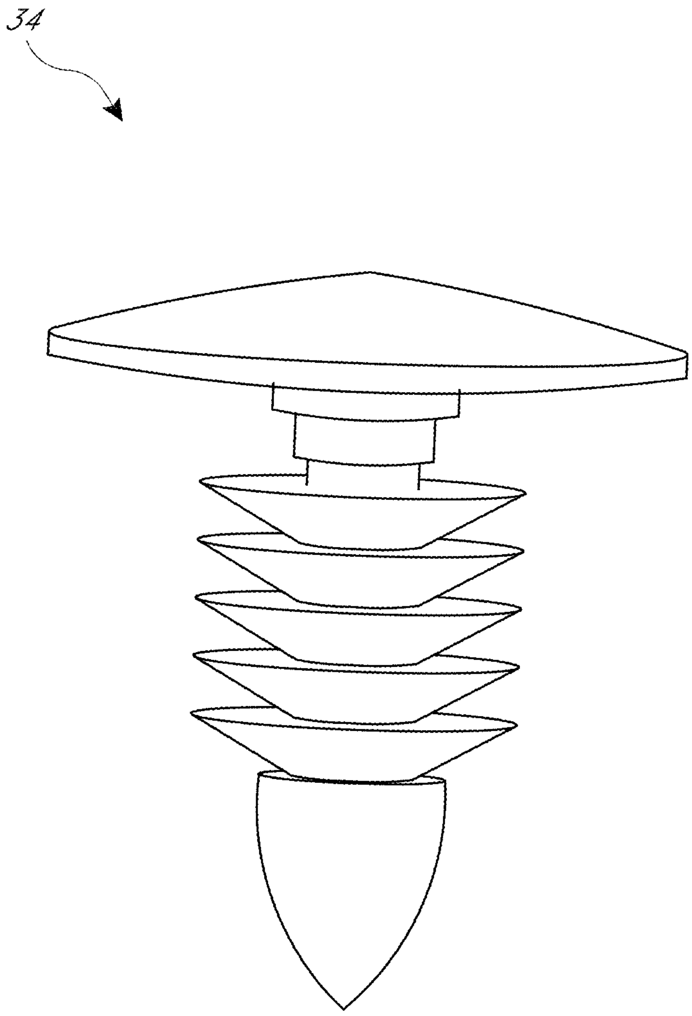
FIG. 5 illustrates a perspective view of an example engagement feature.

As illustrated in FIG. 5, the engagement features 34 can comprise plastic push-pins in some embodiments to reduce costs and/or provide strain relief or reduced stress on the PCS 30. The engagement features can comprise rivets or threads. In other embodiments, compression limiters (e.g., rings) can be positioned into the various mounting holes or cut-outs to reduce stress or compression on the PCS 30.

As discussed above, at least a portion of the BMS 2 can be integrated onto the PCS 30. In some embodiments, the BMS 2 is configured to manage the electrical device or battery module 12 conditions (e.g., state of charging, discharging, etc.). The BMS 2 can comprise other features or functions as is understood by one with ordinary skill in the art. A TMS 4 can be integrated onto or electrically connected to the same PCS 30 to provide monitoring of temperature of the electrical device or loads, and provide appropriate heating or cooling as needed via the TE devices 16. The integrated TMS 4 can comprise various features as discussed further below.

In some embodiments, the TBTMS 1 can comprise an air blower 8 and duct system 10 configured to pull and/or push air across a first or second side of each of the TE devices 16. The blower 8 and duct system 10 can comprise a central or main duct 84 configured to extend between the two rows of cells 20 of the battery module 12. In some embodiments, the duct 84 can be attached to a bottom surface of the PCS 30. In other embodiments, the duct 84 can be attached to a top surface of the PCS 30. In some embodiments, as illustrated in FIG. 7, the duct 84 is configured to taper in width between one end 82 and a second end 80. In some embodiments, one end 82 positioned more proximal to the air blower 8 relative to the second end 80 is wider and gradually tapers in a direction towards the second end 80. In some embodiments, duct 84 and other air flow components can be optimized or sized to reduce pressure loss across the TE modules or duct 84 and provide even air distribution or air pull.

In some embodiments, positioned along and branching out from the central duct 84 are multiple outlets (or inlets) 74 depending on the application (e.g., a manifold type configuration). In some embodiments, the outlets 74 can comprise openings 88 oriented in a direction generally transverse to air flow directed to and/or from the air blower 8 in the central duct 84. The outlet openings 88 can be configured to attach and/or surround an outer perimeter of the fins 28 of the heat transfer devices 26 such that the TMS 4 comprises a duct 84 connected to multiple TE modules 32. The openings 88 can be sized to fit tightly around the fins 28 of top and bottom TE devices 16. Thermal grease or foam can be layered on the openings to form a seal between the outlets 74 and the fins 28. In some embodiments, each of the TE modules 32 comprises a localized corresponding outlet/inlet 74. In other embodiments, all of the TE modules have a single combined outlet/inlet 74.

In some embodiments, the air blower 8 can be attached or connected to the duct system 10 to distribute or push air among the multiple TE modules 32 via the outlets 74. In some embodiments, the air blower 8 can draw or pull air across each of the TE modules 32. Integrated controls can provide a switch to either push or pull air across the fins 28. In a cooling mode, the heated waste air can be pulled toward the blower 8 and exited or allowed to escape through the outlet 86 of the air blower 8. In some embodiments, the waste air can be vented to the outside environment, outside a housing, shell or enclosure the battery module 12 is positioned in, or into another conduit (e.g., waste heat removal system) connected to the outlet 86 to provide heated air as needed (e.g., for heating seats and/or a passenger compartment, etc.).

In some embodiments, the air is only pulled across each of the TE modules 32 rather than pushed. When the air is pulled by the fan or air blower 8, rather than pushed, the air does not need to travel through the blower or device the battery module 12 is providing power to before reaching the heat exchangers or fins 28 of the TE module. The air is instead pulled across the fins 28 and exhausted at the outlet 86. For example, the air is not heated by the heat from the motor of the blower 8 when the air is pulled. In the context of a car, the air is not heated by the exhaust system before being pushed across the waste side of the TE modules 32 when the air is pulled. In such an embodiment, the inlet for the air is at the heat exchangers or fins 28 of the TE modules 32 (e.g., inlet 74) and the outlet 86 for the air is at the blower 8. When the air is pushed, the inlet is at the outlet 86 of the blower 8 and the outlet is at the heat exchangers or fins 28 of the TE module 32 (e.g., outlet 74). In some embodiments, then the air is pushed and the outlet is at the heat exchangers or fins 28 of the TE modules 32, an additional conduit is required to transport the waste heat away from the TE modules 32, the battery module 12, and/or housing the battery module is positioned in. When the air is pulled, the air can be exhausted out the outlet 86 of the blower 8. In some embodiments, this reduced complexity of the system because the air can be exhausted out the outlet 86 without an additional conduit or waste heat removal system. In some embodiments, the air temperature is half a degree cooler when pulled versus pushed across the heat exchangers or fins 28 of the TE module 32.

In some embodiments, the air blower 8 and duct system 10 can comprise one or more attachment features 78 for securing the system to the electrical device under management (e.g., battery module 12). In some embodiments, connections and controls for managing the blower 8 can be integrated onto the PCS 30. In some embodiments, as discussed above, the TMS or BMS of the TBTMS 1 can regulate the blower 8 output to optimize the system efficiency (e.g., increase & decrease the airflow, power or, motor speed of the blower 8 to match cooling or heating requirements of the battery module 12). In some embodiments, the TMS, BMS and/or blower can be connected such that data or conditions monitored by the TMS and/or BMS can be used to regulate the blower output to optimize the system efficiency. In some embodiments, the blower 8 is regulated by a controller such that a thermal gradient produced by cooling or heating the battery module 12 through the electrical conductors reduces or eliminates the thermal gradient produced during charging or discharging of the battery module 12.

As illustrated in FIG. 11, engagement features 52 can comprise bolts, pins, rivets or screws for connecting and securing in position the PCS 30, electrical conductors 14 and bus bar 6. In some embodiments, the bolts are provided to make an electrical connection between these components. The engagement features 52 can thus be electrically and thermally conductive. In some embodiments, these engagement features 52 can be configured to minimize the electrical resistance between the electrical conductor 14 and bus bar 6.

Figure 12:
FIG. 12 illustrates a perspective view of another example thermoelectric battery thermal management system.
Figure 13:
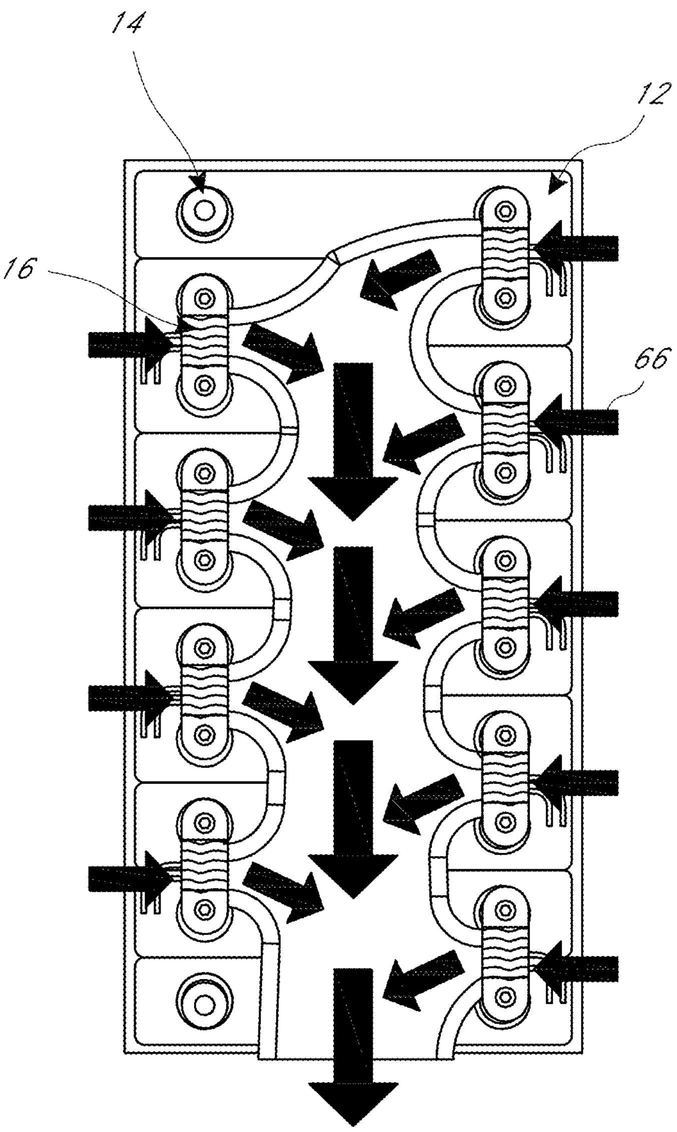
FIG. 13 illustrates a top view of the example system of FIG. 12.
Figure 14:
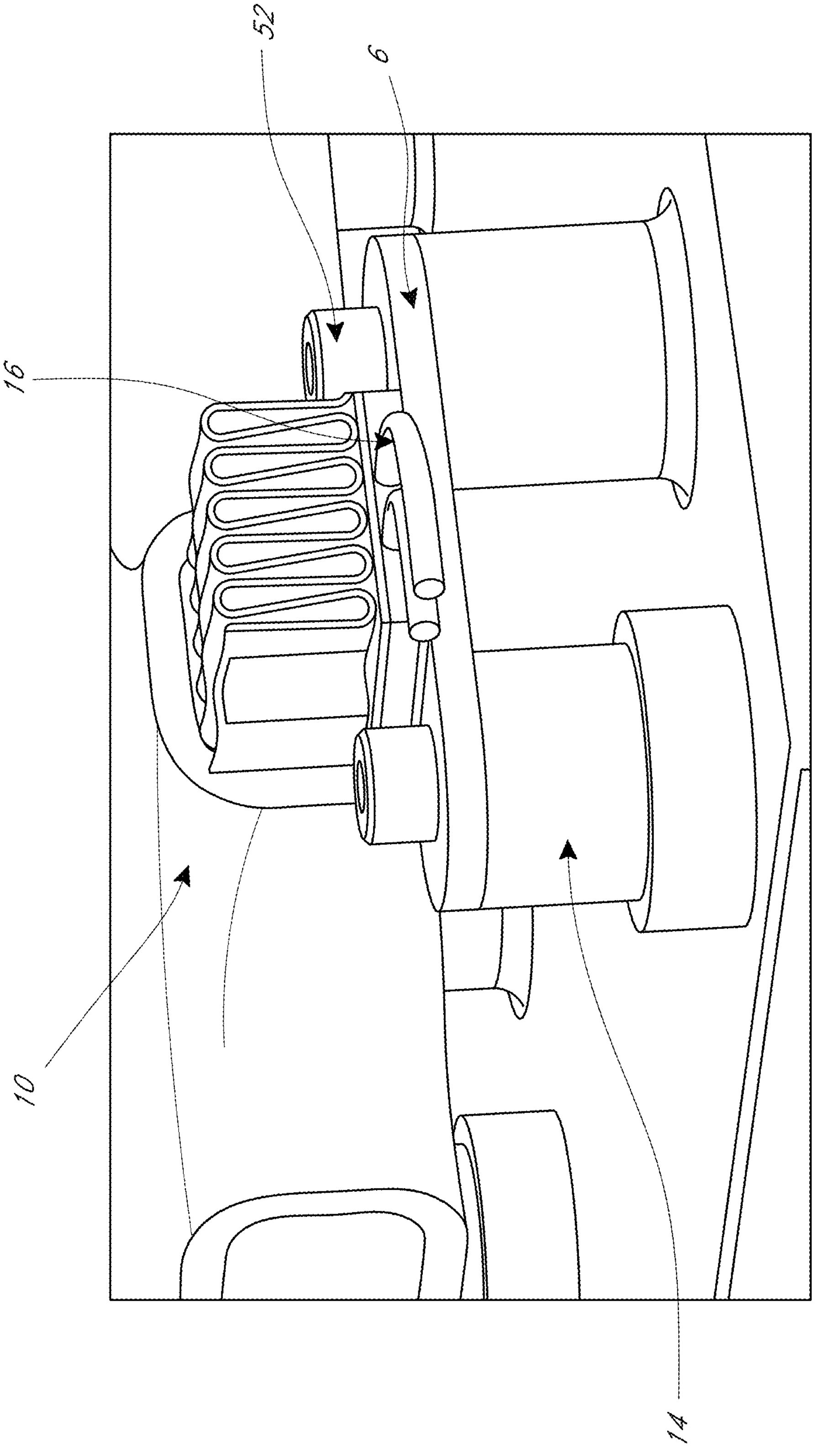
FIG. 14 illustrates a partial view of components of the example system of FIG. 12.

One or more features or components discussed above can be absent (e.g., PCS 30, TE device 16) or different in certain thermoelectric battery thermal management systems. In some embodiments, as illustrated in FIGS. 12-14, one or more components such as a duct system 10, TE modules 32 and bus bars 6, can be attached to electrodes 14 of a battery module 12 directly without being attached to a PCS 30. In some embodiments, only one TE device 16 or module 32 is positioned on a bus bar 6. In some embodiments, engagement features 52 secure the bus bars 6 to the electrodes 14. In some embodiments, as illustrated in FIG. 13, air can be pulled across the TE devices 16 into the duct system 10 (represented by arrows 66).

In some embodiments, the TMS 4 can comprise a controller or control system configured to adjust electric power (e.g., polarity of voltage/current) delivered to the thermoelectric devices 16 such that thermal energy is transferred to or away (e.g., heating and/or cooling) from the temperature-sensitive region of the electrical device (e.g., battery module 12) via the electrical conductor 14.

In some embodiments, the controller or control system can adjust the electric power level (e.g., voltage and/or current, etc.) delivered to or away from the thermoelectric device 16 to provide heating and cooling levels as desired.

In some embodiments, the thermal handling capacity of the thermoelectric device 16 is designed or configured to be adequate to remove the heat produced in a cell or region of an electrical device during operation (e.g., battery module 12). The controller or control system (e.g., electronic control unit, etc.) regulates the operation of the thermoelectric device 16 in response to the thermal condition of the cell, its current mode of operation, the inputs from pack-level signals, inputs from a sensor and/or other inputs as described herein. As a result, the thermoelectric device 16 can pump away the heat produced in a cell. In some embodiments, the thermoelectric device 16 can pump heat to the cell as necessary.

In some embodiments, as discussed above the thermoelectric device 16 and/or the controller (e.g., electronic control unit) may be fully or partially powered by the exact cell or electrical device of which thermal condition is being managed. In other embodiments, the electric power may be provided from other sources such as an external power supply as discussed above with aforementioned embodiments.

In some embodiments, the thermoelectric management system 4 can comprise a sensor(s). The sensor(s) can be in thermal communication with the electrical device and in electrical communication with the controller and provide any of the inputs as described above to be monitored by the controller or control system. Inputs or signals from other sensors (not shown) can also be provided to the controller or control system to be monitored as part of a control algorithm to provide sufficient heating and/or cooling to reduce, minimize or eliminate a thermal gradient or other uneven temperature distribution.

As discussed above, in some embodiments, the TMS may be integrated with the rest of the electronics supporting the device under thermal management. For example, if such device is a battery module, then it is typically outfitted with a Battery Management System, or BMS 2, which is configured to monitor the health of the battery and/or administer control functions in response to internal and/or external changes. The TMS functionality can be integrated into the BMS and can be co-located on the same printed circuit substrate or using the same chipsets that perform BMS functions.

Figure 15:
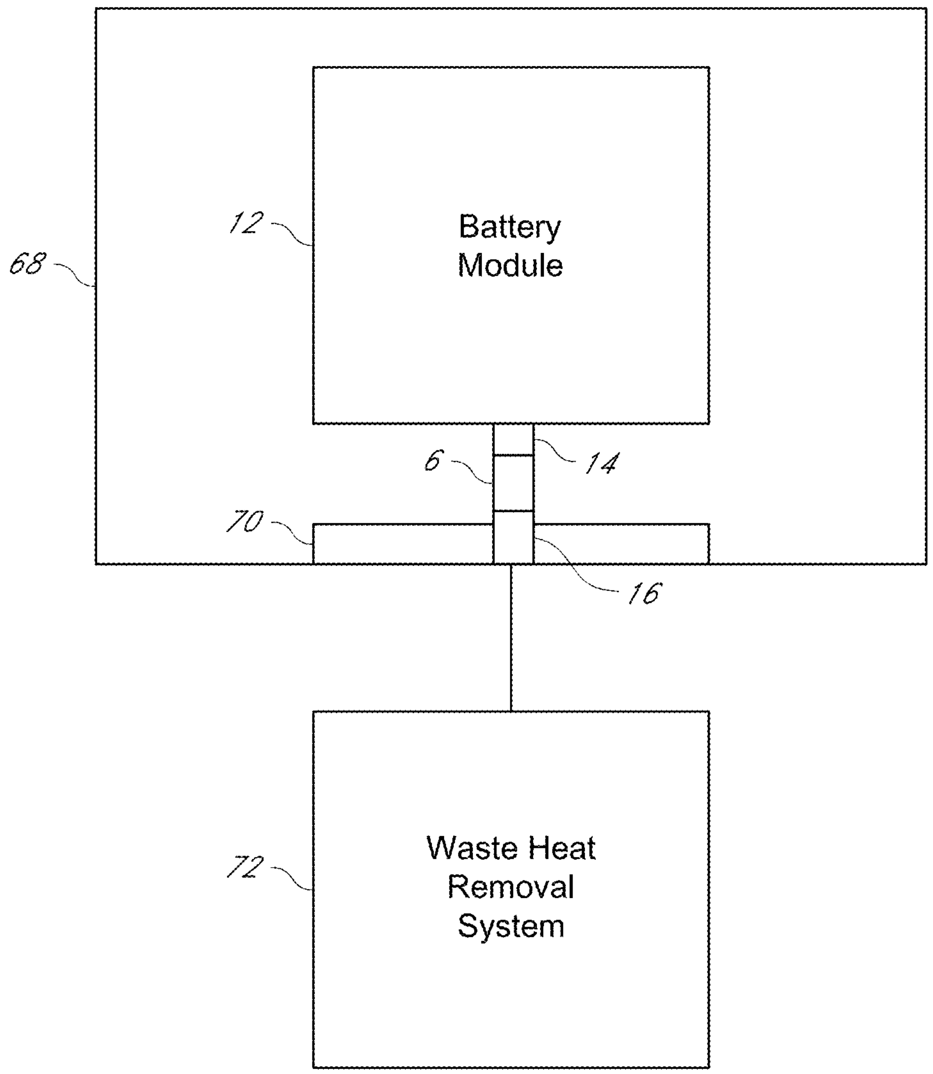
FIG. 15 illustrates an example thermoelectric battery thermal management system.

In some embodiments, as schematically illustrated in the block diagram of FIG. 15, the battery module 12 is sealed within an enclosure, housing, and/or shell 68. In some embodiments, the battery module 12 is unsealed in an enclosure as illustrated in FIGS. 1-14. In some embodiments, when the battery module 12 is sealed within an enclosure 68, TE devices 16 are only mounted on a top surface of bus bar 6 and not on a bottom surface.

In some embodiments, when the battery module 12 is sealed, the TBTMS comprises one or more windows 70 or openings in the casing, enclosure 68 or shell of the battery module 12. TE devices 16 are only mounted or attached to or on a top surface of bus bars 6 and not a bottom surface. At least a portion of the TE devices 16 (e.g., one or more surfaces, sides, elements, and/or materials) are positioned within or abut the windows 70. A PCS 30 positioned within the enclosure 68 includes cut-outs only for the TE devices 16 and not for ducts or outlets. As described above, in some embodiments, the bus bar 6 is attached to an electrical conductor 14 (e.g., electrode) of the battery module 12 and/or PCS 30. In some embodiments, the waste surfaces or sides of the TE devices 16 can be in direct thermal communication (e.g., surface to surface contact) or indirect thermal communication with heat exchange surfaces (e.g., fins, heat sink) of a waste heat transport or removal system 72 positioned outside the thermal windows 70 and/or enclosure 68. In some embodiments, the waste heat removal system 72 is configured to transport waste heat away from the thermoelectric devices or dissipate the heat from the waste side of the thermoelectric devices. As discussed above, thermal grease or other interstitial materials may also be used between the surfaces of the components and systems. The thermal windows 70 provide access for the mounting or attachment of the waste heat removal system 72 (e.g., duct and blower assembly) to the waste sides of the TE devices 16 in the enclosure 68. In some embodiments, the windows 70 comprise a high thermally conductive material attached on one side to the waste side of the thermoelectric device and attached on the other side to a waste heat removal system 72. In some embodiments, the waste heat removal system 72 comprises a fluid loop or conduit in thermal communication with a waste side of the TE device 16 and a heat sink (e.g., radiator) as described further below. In some embodiments, the waste heat removal system 72 comprises a liquid loop or conduit in thermal communication with a waste side of the TE device 16 and a heat sink (e.g., radiator) as described further below. As described above, the TE devices 16 can be individually controlled and/or share a common waste heat removal system 72. Each TE device 16 can be accessible through a respective window 70 or a window 70 can be sized to provide access for the waste heat removal system 72 to one or more TE devices 16. In some embodiments, the TE devices 16 each comprise individual waste heat removal systems 72.

In some embodiments, a heat pipe can be provided as a waste heat transport or removal mechanism 72. In some embodiments, waste heat from a TE device 16 can be dissipated in a heat sink. Examples of heat sinks include heat exchangers (e.g., liquid heat exchanger, fins), waste streams, other structures for dissipating heat, and combinations of structures. A heat sink can be attached to the waste side or surface of each TE device 16 and/or waste heat removal system 72. The heat sink can be cooled by air, liquid, or, alternatively, it can be a solid member connecting the TE device 16 with a bigger solid heat sink such as a battery case, car frame, or another structural element that dissipates heat effectively. However, in practical applications, such as, for example, a battery thermal management system, there can be packaging constraints that limit the possibility of bringing the cooling media close to the waste side of the TE device. Alternatively, a heat or thermal transport device may be used to move the heat from the waste side of the TE device to another location where heat dissipation may be implemented effectively.

In some embodiments, a heat transfer device can be used to connect the waste side or surface of the TE device 16 to a heat sink where the heat is ultimately dumped by, for example, air, liquid, or solid, as illustrated in FIG. 15. Such a heat sink can be for example the liquid cooling circuit of the car, a radiator, auxiliary (e.g., for the air conditioning system) or secondary radiator (e.g., heater core) different from the main radiator, or an air cooled heat sink, ambient air, working fluid, fluid reservoir, or a solid body (e.g., battery case or car frame).

In certain embodiments, one or more conduits of a waste heat removal system are selectively fluidically coupled by one or more valves to an engine coolant loop or an auxiliary cooling radiator of a vehicle. In certain embodiments, the one or more conduits are fluidically coupled by one or more valves to a heat exchanger in thermal communication with a vehicle battery or a vehicle fuel tank.

Discussion of the various embodiments herein has generally followed the embodiments schematically illustrated in the figures. However, it is contemplated that the particular features, structures, or characteristics of any embodiments discussed herein may be combined in any suitable manner in one or more separate embodiments not expressly illustrated or described. In many cases, structures that are described or illustrated as unitary or contiguous can be separated while still performing the function(s) of the unitary structure. In many instances, structures that are described or illustrated as separate can be joined or combined while still performing the function(s) of the separated structures.

Various embodiments have been described above. Although the inventions have been described with reference to these specific embodiments, the descriptions are intended to be illustrative and are not intended to be limiting. Various modifications and applications may occur to those skilled in the art without departing from the spirit and scope of the inventions described herein.

What is claimed is:

1. A method for thermally managing a battery cell, the method comprising:

controlling charging and discharging of a battery cell using a battery management controller attached to a printed circuit substrate;

controlling electric power delivered to a thermoelectric device using a thermoelectric management controller attached to the printed circuit substrate; and supplying electric power to the thermoelectric device from a power connection attached to the printed circuit substrate;

wherein the thermoelectric device is configured to transfer thermal energy between a main surface and a waste surface upon application of electric power to the thermoelectric device;

wherein the main surface of the thermoelectric device is in physical contact with a bus bar;

wherein the bus bar is in thermal and electrical communication with an electrode of the battery cell;

wherein the electrode is configured to deliver electric power to or from the battery cell and to serve as a conduit for conducting thermal energy between a temperature-sensitive region of the battery cell and the thermoelectric device; and wherein the battery cell is capable of being heated or cooled by adjusting a polarity of electric current delivered to the thermoelectric device.

2. The method of claim 1, wherein the thermoelectric management controller is configured to control the polarity of electric current provided to the thermoelectric device, wherein a first polarity of electric current is provided in a cooling mode of system operation, and wherein a second polarity opposite the first polarity of electric current is provided in a heating mode of system operation.

3. The method of claim 1, wherein the battery management controller is configured to manage the charging and discharging of the battery cell.

4. The method of claim 1, comprising a temperature sensor in thermal communication with the battery cell and in electrical communication with the thermoelectric management controller.

5. The method of claim 1, wherein the printed circuit substrate comprises a cutout portion configured to receive the thermoelectric device.

6. The method of claim 1, wherein a surface of the bus bar is in direct physical contact with a surface of the electrode.

7. The method of claim 1, comprising pushing or pulling air across the waste surface of the thermoelectric device with a blower and duct assembly attached to the printed circuit substrate, and increasing or decreasing airflow from a blower of the blower and duct assembly to match cooling or heating requirements of the battery cell to optimize system efficiency.

8. The method of claim 1, wherein the bus bar comprises one or more mounting holes for mounting the bus bar to the printed circuit substrate and the electrical conductor.

9. The method of claim 1, wherein the battery cell is sealed within an enclosure, the enclosure comprising a window abutting the thermoelectric device configured to provide access for substantial thermal communication between a portion of a waste heat removal system positioned outside the window and the waste surface of the thermoelectric device.

10. The method of claim 9, wherein the window comprises at least a portion of a blower and duct assembly.

11. The method of claim 1, wherein thermoelectric devices are attached to both a top surface and a bottom surface of the bus bar.

12. A method of manufacturing a thermoelectric battery thermal management system, the method comprising:

connecting a printed circuit substrate to a battery management system configured to control charging and discharging of a battery cell and to a thermoelectric management system configured to control electric power delivered to a thermoelectric device, wherein the thermoelectric device is configured to transfer thermal energy between a main surface and a waste surface upon application of electric power to the thermoelectric device;

attaching the main surface of the thermoelectric device to a bus bar;

connecting the bus bar to an electrical conductor that is in thermal and electrical communication with the battery cell, wherein the electrical conductor is configured to deliver electric power to or from the battery cell such that the electrical conductor serves as a conduit for conducting thermal energy between a temperature-sensitive region of the battery cell and the thermoelectric device; and connecting a power connection positioned on the printed circuit substrate to the thermoelectric device for supplying electric power to the thermoelectric device.

13. The method of claim 12, comprising connecting a controller to the thermoelectric management system, wherein the controller is configured to control a polarity of electric current provided to the thermoelectric device, wherein a first polarity of electric current is provided in a cooling mode of system operation and wherein a second polarity opposite the first polarity of electric current is provided in a heating mode of system operation.

14. The method of claim 12, comprising connecting a controller with the battery management system configured to administer control functions to the battery cell.

15. The method of claim 12, comprising connecting a temperature sensor in thermal communication with the battery cell and in electrical communication with the thermoelectric management system.

16. The method of claim 12, comprising forming a cutout in the printed circuit substrate configured to receive the thermoelectric device.

17. The method of claim 12, comprising connecting the bus bar to the electrical conductor such that a surface of the bus bar is in direct physical contact with a surface of the electrical conductor.

18. The method of claim 12, comprising attaching a blower and duct assembly to the printed circuit substrate, the blower and duct assembly configured to push or pull air across the waste surface of the thermoelectric device, wherein the blower and duct assembly comprises a controller in electrical communication with at least one of the battery management system and thermoelectric management system such that at least one of the battery management system and thermoelectric management system is configured to optimize system efficiency such that airflow from a blower of the blower and duct assembly is increased or decreased to match cooling or heating requirements of the battery cell.

19. The method of claim 12, comprising mounting the bus bar to the printed circuit substrate and the electrical conductor.

20. The method of claim 12, comprising sealing the battery cell within an enclosure, the enclosure comprising a window abutting the thermoelectric device configured to provide access for substantial thermal communication between a portion of a waste heat removal system positioned outside the window and the waste surface of the thermoelectric device.

21. The method of claim 12, comprising attaching thermoelectric devices to both a top surface and a bottom surface of the bus bar.

* * * * *